United States Patent [19]
Huffman et al.

[11] Patent Number: 6,082,374
[45] Date of Patent: Jul. 4, 2000

[54] FLUORINE ASSISTED STRIPPING AND RESIDUE REMOVAL IN SAPPHIRE DOWNSTREAM PLASMA ASHER

[76] Inventors: Maria Huffman, 15300 Spring Meadows Dr., Germantown, Md. 20874; Palanikumaran Sakthivel, 391 West Side Dr., #203, Gaithersburg, Md. 20878; Teresa Zimmerman, 506 Wood St., Baltimore, Md. 21225; Thomas Noble, 6160 Mississippi La., New Market, Md. 21774

[21] Appl. No.: 08/936,548

[22] Filed: Sep. 24, 1997

Related U.S. Application Data

[60] Provisional application No. 60/026,614, Sep. 24, 1996.

[51] Int. Cl.[7] .................................. B08B 6/00; C25F 3/30
[52] U.S. Cl. ........................... 134/1.1; 134/1.2; 438/725; 118/723 R
[58] Field of Search ................................. 118/715, 723 R; 156/345; 134/1.2, 1.1; 219/121.43; 438/689, 725; 313/231.31; 430/323; 204/192 E

[56] References Cited

U.S. PATENT DOCUMENTS

| | | | |
|---|---|---|---|
| 4,063,803 | 12/1977 | Wright et al. | 359/894 |
| 4,201,579 | 5/1980 | Robinson et al. | 430/32 |
| 4,340,456 | 7/1982 | Robinson et al. | 204/192.33 |
| 4,817,558 | 4/1989 | Itoh | 118/725 |
| 4,990,229 | 2/1991 | Campbell et al. . | |
| 5,122,251 | 6/1992 | Campbell et al. . | |
| 5,262,610 | 11/1993 | Huang et al. | 219/121.43 |
| 5,366,557 | 11/1994 | Yu | 118/725 |
| 5,397,395 | 3/1995 | Sano et al. | 118/718 |
| 5,429,070 | 7/1995 | Campbell et al. . | |
| 5,542,559 | 8/1996 | Kawakami et al. | 216/67 |
| 5,625,259 | 4/1997 | Holber et al. | 315/111.21 |
| 5,747,917 | 5/1998 | Herchen | 313/231.31 |
| 5,789,322 | 8/1998 | Brown et al. | 438/689 |
| 5,824,604 | 10/1998 | Bar-Gadda | 438/725 |
| 5,895,548 | 4/1999 | Ettinger et al. | 156/345 |

*Primary Examiner*—Randy Gulakowski
*Assistant Examiner*—Saeed Chaudhry
*Attorney, Agent, or Firm*—Pollock Vande Sande & Amernick, R.L.L.P.

[57] ABSTRACT

A method for removing material from a substrate. A plasma is generated in a plasma generating and discharge device including a sapphire plasma tube. At least one fluorine-containing compound is introduced into the plasma. A forming gas is introduced into the plasma. The plasma is directed toward the material to be removed from the substrate.

13 Claims, 34 Drawing Sheets

| ASH RATE μm/min | OXIDE LOSS Å/min | POWER (W) | WAFER # | CF$_4$ FLOW sccm | % CF$_4$ |
|---|---|---|---|---|---|
| | | | OXYGEN FLOW: 1000 | | |
| 0.273 | 15.77 | 1000 | 1 | 50 | 4.762 |
| | | | OXYGEN FLOW: 2000 | | |
| 0.254 | 8.975 | 1500 | 4 | 50 | 2.439 |
| 0.255 | 6.555 | 1500 | 5 | 50 | 2.439 |
| | | | | | |
| 0.142 | 4.882 | 1000 | 6 | 50 | 2.439 |
| 0.149 | 4.68 | 1000 | 8 | 50 | 2.439 |
| 0.150 | 4.511 | 1000 | 9 | 50 | 2.439 |
| | | | | | |
| 0.385 | 12.56 | 2000 | 7 | 50 | 2.439 |
| | | | OXYGEN FLOW: 1500 | | |
| 0.196 | | 1000 | 2 | 50 | 3.226 |
| 0.197 | | 1000 | 3 | 50 | 3.226 |

FIG. 4

| OXIDE LOSS RATE | | GAS FLOW(sccm) | |
|---|---|---|---|
| A/min | POWER(W) | O$_2$ | CF$_4$ |
| 9 | 1000 | 2000 | 50 |
| 35 | 1000 | 1000 | 75 |
| 17 | 1000 | 2000 | 150 |
| 36 | 1000 | 1000 | 75 |
| 23 | 1000 | 2000 | 150 |
| 143 | 2000 | 1000 | 150 |
| 29 | 1250 | 2000 | 150 |
| 27 | 1250 | 2000 | 150 |
| 55 | 2000 | 2000 | 150 |
| 60 | 2000 | 2000 | 150 |
| 24 | 1000 | 2000 | 150 |
| 21 | 1000 | 2000 | 150 |

FIG. 5

TYPICAL VIA STRUCTURE.

FLUORINE ASSISTED STRIPPING AND RESIDUE REMOVAL IN SAPPHIRE DOWNSTREAM PLASMA ASHER

This application claims benefit of provisional 60/026,614 filed Sep. 24, 1996.

FIELD OF THE INVENTION

The invention relates to a method and apparatus for removing materials from a substrate. In particular, the present invention relates to removing materials from substrates in semiconductor manufacturing processes.

BACKGROUND OF THE INVENTION

Several steps in the manufacture of semiconductor devices require the removal of photoresist (PR) and other materials from substrates. The "removal" of PR is synonymous with "ash," "burn," "strip," and "clean." One example of a substance that may be removed is a residue that may remain on a silicon wafer after an etching step is completed. Such residue is frequently composed of a polymeric material that may be present in the form of "veils" and is caused by over etching during etch processes.

One way to remove PR and other materials such as those described above is by directing a plasma stream at the substrate with the attached substance. In some cases, the substance is removed from the substrate by the "afterglow" of the plasma rather than the plasma itself.

One gas that may be used in generating the plasma to strip the substrates is oxygen. In order to increase the effectiveness and/or efficiency of processes for removing materials from a substrate, a source of fluorine may be added to the oxygen.

A problem inherent in utilizing a fluorine-containing substance is degradation of the plasma generating/discharge device by the fluorine. For example, plasma generating and discharge devices typically include a tube through which the plasma flows. Microwave or radio-frequency energy is introduced into the tube to excite the gas and form the plasma. Typically, the tube is made of quartz. It was observed that fluorine was particularly destructive to the quartz tubes. Therefore, quartz tubes were replaced by sapphire tubes in order to overcome the corrosive effects of fluorine.

Although the sapphire plasma discharge tube included in the plasma generating and discharge devices overcame the significant degradation of the quartz tubes, ash rates of photoresist utilizing the sapphire tube were markedly lower than ash rates observed when utilizing the quartz tubes.

One reason for the decreased efficiency of ash by an oxygen plasma generated with a plasma generating and discharge device that includes a sapphire tube is that oxygen atoms in the plasma may be lost at the surface of the sapphire to a much greater degree than at the surface of the quartz.

SUMMARY OF THE INVENTION

The present invention was developed through efforts to overcome the above-described as well as other problems.

Accordingly, one object of the present invention is to provide a method and apparatus that reduces the recombination/loss rate of oxygen atoms on the surface of a sapphire tube in a plasma generating and discharge device and, hence, increases the effectiveness/efficiency of standard ashing processes.

An additional object of the present invention is to provide a method and apparatus for removing materials from a substrate utilizing an oxygen plasma with at least one added fluorine-containing compound while maintaining minimal oxide loss.

A further object of the present invention is to provide a method and apparatus for removing material from a substrate utilizing forming gas.

A still further object of the present invention is to increase the effectiveness of residue removal from a substrate.

In accordance with these and other objects and advantages, aspects of the present invention provide a method for removing material from a substrate. According to the method, a plasma is generated in a plasma generating and discharge device including a sapphire plasma tube. At least one fluorine-containing compound is introduced into the plasma. A forming gas is introduced into the plasma. The plasma is directed toward the material to be removed from the substrate.

Other aspects of the present invention provide a device for removing material from a substrate. The device includes a plasma generating and discharge device including a sapphire plasma tube. The device also includes a source of at least one gas for introducing the at least one gas into the plasma generating and discharge device for forming a plasma. At least one source of at least one fluorine-containing compound is provided for introducing at least one fluorine-containing compound into the plasma generating and discharge device. At least one source of at least one forming gas is also provided for introducing the at least one forming gas into the plasma. The device also includes apparatus for directing the plasma toward the material to be removed from the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

FIG. 4 represents a table illustrating ash rates and oxide loss rates for various embodiments of processes according to the present invention;

FIG. 5 represents a table illustrating oxide loss rates achieved when applying various embodiments of processes according to the present invention;

FIG. 26b represents a photomicrograph illustrating a via after treatment with a process according to the present invention similar to the process described in Example 4, wherein the process time was shortened to eliminate the undercutting seen in FIG. 26a;

DETAILED DESCRIPTION OF THE INVENTION

Figure 1:
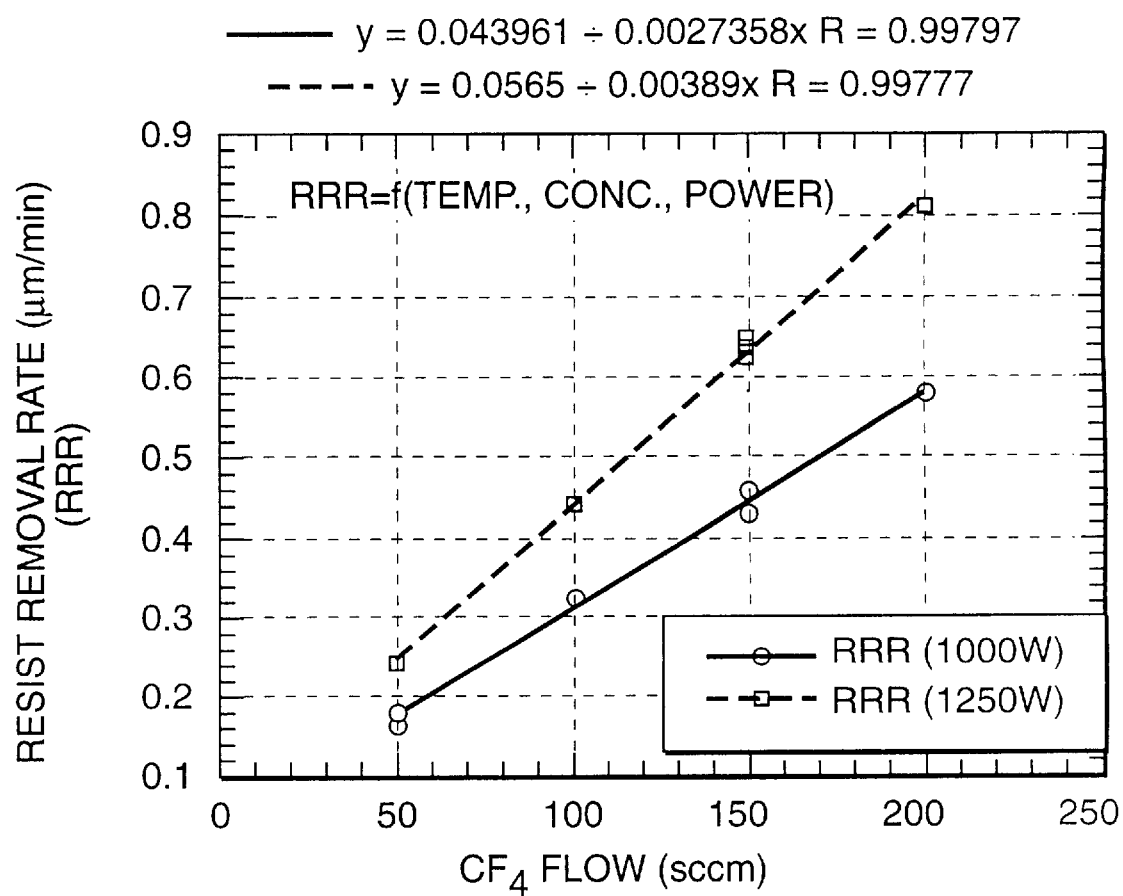
FIGS. 1–3 represent graphs that demonstrate various resist removal rates given different flow rates of oxygen-containing compound(s) and fluorine-containing compound(s) and power levels, without any additional source of heat, according to various embodiments of processes according to the present invention.

As discussed above, the present invention provides an enhanced process for removing photoresist and other materials from a substrate. It has been unexpectedly discovered that a combination of techniques may be utilized to increase the efficiency and effectiveness of ash and residue removal.

The present invention in part was developed after an investigation of the "memory effect" in which ash rates continued to be enhanced after the cessation of flow of fluorine-containing compound(s) into the plasma. The memory effect may be a result of residual fluorine, fluorine seasoning of, or remaining in and/or on, all surfaces exposed to it, including chamber walls and the plasma tube of a plasma generating and discharge device. This residual fluorine will provide the effects of fluorine addition to the plasma without actual fluorine being added to the plasma for one or more additional wafers being processed after the addition of fluorine has ceased.

The techniques included in the method of the present invention include generating an oxygen plasma in a plasma generating and discharge device that includes a sapphire plasma discharge tube, adding at least one source of fluorine to the oxygen plasma, and introducing a source of forming gas to the oxygen plasma. By utilizing a combination of these techniques, it has been unexpectedly discovered that ash rates may be increased significantly while maintaining plasma tube integrity.

Additionally, the techniques of the present invention have been demonstrated to remove residues post via etch, oxide etch, poly, nitride, implant, and other levels, while not causing additional plasma damage.

According to the process of the present invention, a plasma generating and discharge device such as in U.S. Pat. application Ser. No. 07/626,451 may be utilized to generate plasma. Alternatively, any other plasma generator capable of generating oxygen plasma for use in applications such as removing materials from a substrate by ashing may be utilized. Examples of commercially available plasma generating and discharge devices that could be utilized to carry out the method of the present invention include the FUSION ENHANCED STRIP ASHER and FUSION GEMINI ENHANCED STRIP ASHER, both available from Fusion Semiconductor Systems. Other examples of plasma generating and discharge devices that may be utilized according to the present invention generate a plasma utilizing radio frequency (RF) energy.

According to the process of the present invention, an oxygen plasma is generated in the plasma generating and discharge device while source(s) of fluorine-containing compound(s), nitrogen-containing compound(s), and hydrogen-containing compound(s) are added to the gas inlet of the plasma generating and discharge device. It has been found that the introduction of this combination into the plasma generating and discharge device with the sapphire plasma tube unexpectedly results in a significantly increased rate of removal of certain materials from a substrate. The unexpected result achievable according to the present invention of vastly improved rate of removal of material from a substrate while not degrading the container by utilizing a sapphire plasma tube was not known.

As discussed above, it was known that utilizing a sapphire plasma tube markedly decreased ashing rates. Therefore, although the advantages of utilizing oxygen-containing compound(s), fluorine-containing compound(s), and nitrogen-containing compound(s) or gases that include oxygen, fluorine, and nitrogen may have been known, it was not known to utilize this combination of materials in a sapphire plasma tube.

According to the present invention, at least one oxygen-containing compound may be introduced into the plasma generator as molecular oxygen, atomic oxygen, ozone, or other oxygen-containing compound such as $N_2O$, $NO_2$, $NO$, $CO_2$, or $CO$. The at least one oxygen-containing compound may be introduced into the plasma generating and discharge device at a rate of from about 200 standard cubic centimeters per minute (sccm) to about 4000 sccm. Alternatively, the at least one oxygen-containing compound may be introduced into the plasma generating and discharge device at a rate of at least about 200 sccm. Similarly, the at least one oxygen-containing compound may be introduced into the plasma generating and discharge device at a rate of up to about 4000 sccm. Preferably, the at least one oxygen-containing compound in the form of $O_2$ is introduced at a rate of from about 1500 sccm to about 2000 sccm. If another gas were used, the flow rate would be adjusted to provide an equivalent amount of oxygen to the system.

The flow rate of the at least one oxygen-containing compound preferably generates a pressure in the plasma tube of from about 0.5 torr to about 10 torr. More preferably, the pressure in the process chamber is about 1.5 torr.

Lower flow rates could be used if a lower pressure were desired. For example, some plasma generating and discharge devices utilizing RF energy to generate a plasma may employ lower pressures in the plasma tube. However, any flow rates and pressure could be used if the gases of the method were utilized in a sapphire plasma tube.

At least one source of fluorine may be added to the at least one oxygen-containing compound in a variety of forms. For example, suitable fluorine-containing compounds include $CF_4$, $C_2F_6$, $CHF_3$, $CFH_3$, $C_2H_2F_4$, $C_2H_4F_2$, $CH_2F_2$, $CH_3CF_3$, $C_3F_8$, $SF_6$, and $NF_3$.

The amount of fluorine-containing compound(s) added to the oxygen-containing compound(s) may vary. For example, according to one process of the present invention, the fluorine containing compound(s) is added up to about ten percent of the amount of oxygen in a plasma to be generated by the plasma generator. In absolute terms, the amount of fluorine-containing compound(s) added is up to about 200 sccm.

Forming gas may be added to the oxygen-containing compound(s) and plasma in the plasma generating and discharge device. The forming gas typically is a mixture of at least one nitrogen-containing compound and at least one hydrogen-containing compound in the form of $N_2$ and $H_2$. The forming gas may include up to about 10% $H_2$. The forming gas may be added to the plasma generating and discharge device in an amount up to about 2000 sccm.

The nitrogen-containing compound(s) and hydrogen-containing compound(s) of the forming gas may be provided by sources of nitrogen and hydrogen other than $N_2$ and $H_2$ added to the plasma. In one example, $NO_2$ is used as an oxygen source. The nitrogen of the forming gas could be provided by the N in the $NO_2$. Similarly, the hydrogen of the forming gas could be provided by $CHF_3$ used as a fluorine source.

Processes according to the present invention may include a plurality of steps. In each step, one or more of the materials listed above may be included in the plasma generated in the plasma generating and discharge device. Other process parameters that may be controlled in the operation of the plasma generating and discharge device include the power provided to the plasma generating and discharge device and the temperature of the substrate. The temperature of the substrate may be varied from to from about 20° C. to about 350° C. for different processes.

According to the present invention, the pressure maintained in the plasma generating and discharge device is from about a few millitorr to about 10 torr.

Additionally, the power supplied to a microwave plasma generating and discharge device may vary from about 500 watts to about 2000 watts. Plasma generators using RF to generate plasma may operate at lower power levels. In either case, the power supplied to the plasma generating and discharge device should be sufficient to result in the enhanced removal of material from the substrate, while not causing damage or other unwanted effects to the substrate.

In fact, the oxygen-containing compound(s), nitrogen-containing compound(s), hydrogen-containing compound (s), and fluorine-containing compound(s) may be added in amounts sufficient to result in the enhanced removal of selected material from the substrate, while not causing damage or other unwanted effects to the substrate or the apparatus.

According to one example, a process according to the present invention for removing PR may include a first step of generating a temperature of about 270° C. and a pressure of about 1.5 torr in the plasma generating and discharge device while supplying about 2000 watts of power. About 2000 sccm of oxygen, about 300 sccm of $N_2/H_2$, and about 5 sccm of $CF_4$ are supplied to the plasma generating and discharge device. This temperature, pressure, power, and gas supply are maintained for the minimum time necessary for the plasma generating and discharge device to reach 270° C. In a second step, these conditions are held substantially constant for about 60 seconds.

According to an example of a process according to the present invention for removing residue, the above two steps are first carried out. Then, a third step is carried out in which the power level is decreased, the forming gas is eliminated, and about 5% $CF_4$ is added to the plasma generating and discharge device.

The addition of at least one fluorine-containing material to the oxygen plasma may result in generation of more oxygen atoms in the plasma and minimize the recombination of oxygen atoms on the tube/chamber surface. Fluorine may also cause hydrogen abstraction from the surface of the resist being removed thereby leaving the resist more prone to attack by oxygen atoms, effectively lowering the activation energy required to remove the resist.

At least one hydrogen-containing compound may be added to the oxygen-containing compounds), fluorine-containing compounds), and nitrogen-containing compounds) to provide a cleaner residue removal as well as to lower activation energy. Furthermore, nitrogen present in the mixture may enhance production of oxygen atoms. The present invention also permits low temperature residue removal.

Below are described numerous examples of process according to the present invention and investigations that led up to the present invention. The examples are means to be illustrative in nature and not exhaustive.

Figure 2:
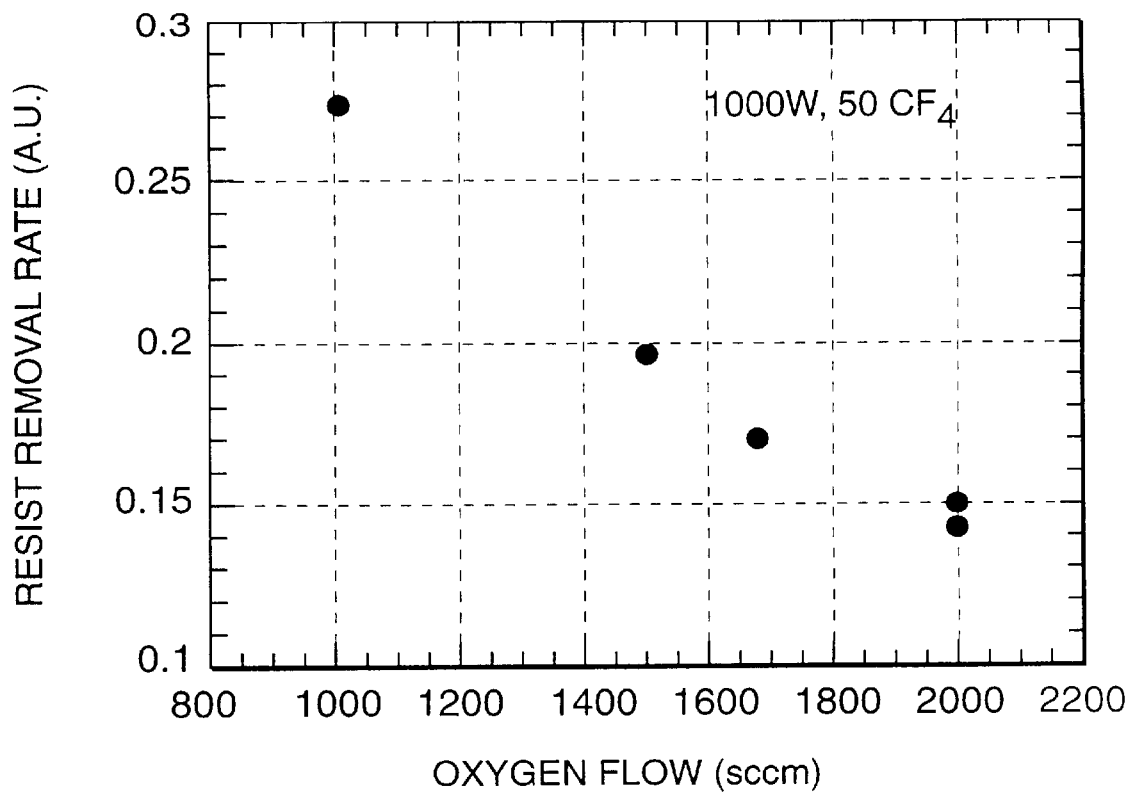
Figure 3:
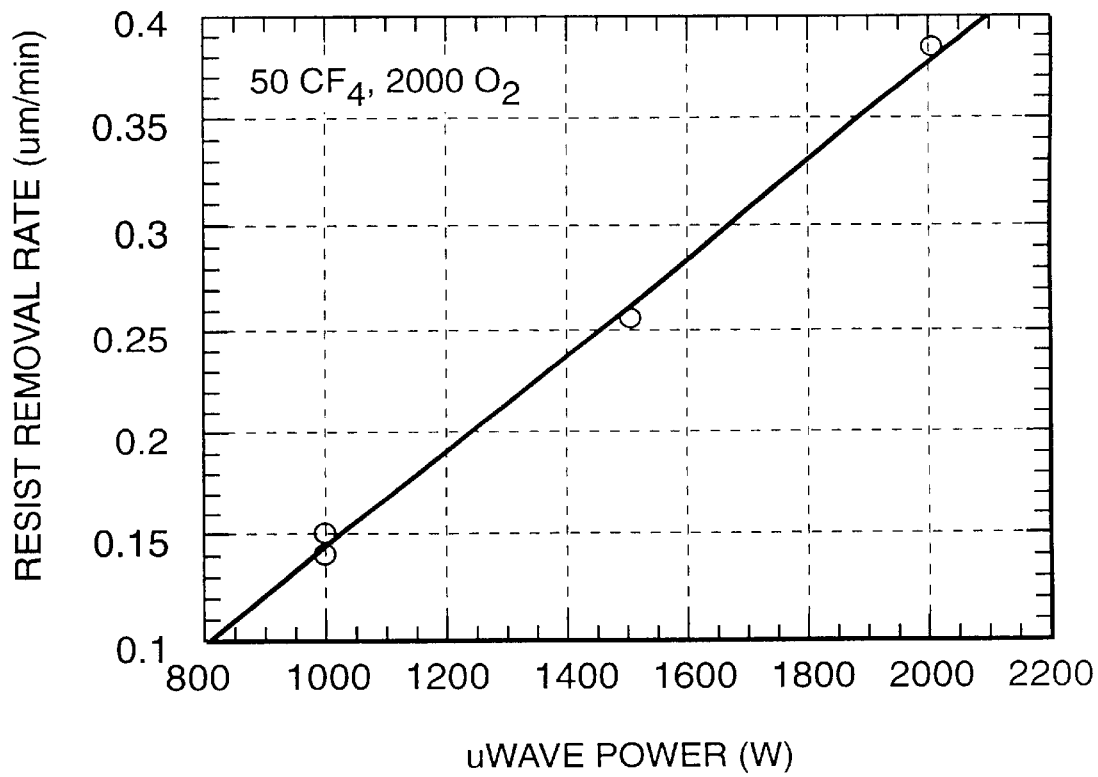

FIGS. 1–3 represent graphs that demonstrate various resist removal rates given different oxygen-containing compound(s) and fluorine-containing compound(s) flow rates and power levels, without any external heat source to the substrate that material is being removed from.

FIGS. 4 and 5 represent a table illustrating ash rates and oxide loss rates for various processes according to the present invention.

FIGS. 6–9 represent graphs demonstrating the different ash rates achieved utilizing a plasma generating and discharge device with a sapphire plasma tube with and without utilizing $CF_4$ and utilizing an oxygen plasma with nitrogen-containing compound(s) and hydrogen-containing compound(s) added as well. The processes utilized to produce the results illustrated in FIG. 6 included three process steps. The first step included a minimum time of about 15 seconds necessary to bring the plasma generating and discharge device up to a temperature of 270° C., at a pressure of 1.5 torr, and supplying the amounts of the gases specified on the horizontal axis of the graph. The second and third steps included the same process parameters, but were carried out for thirteen seconds. The plasma was turned on during the third step, supplying about 1500 watts of power to the plasma generating and discharge device. No oxide loss was detected.

Figure 6:
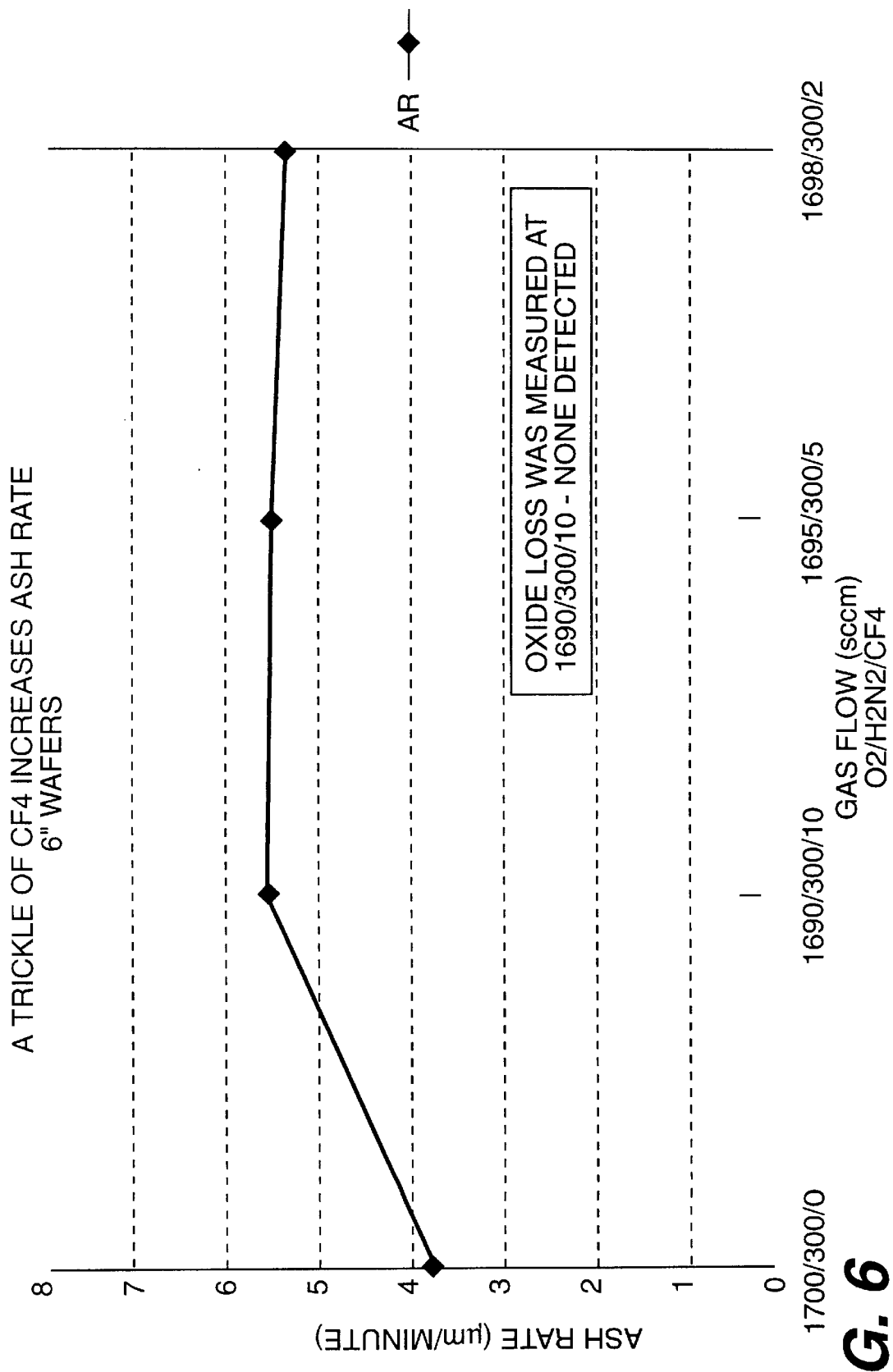
FIGS. 6–9 represent graphs demonstrating the different ash rates achieved utilizing a plasma generating and discharge device with a sapphire plasma tube with and without utilizing $CF_4$ and utilizing an oxygen plasma with at least one nitrogen-containing compound and at least one hydrogen-containing compound added as well according to various embodiments of processes of the present invention.
Figure 7:
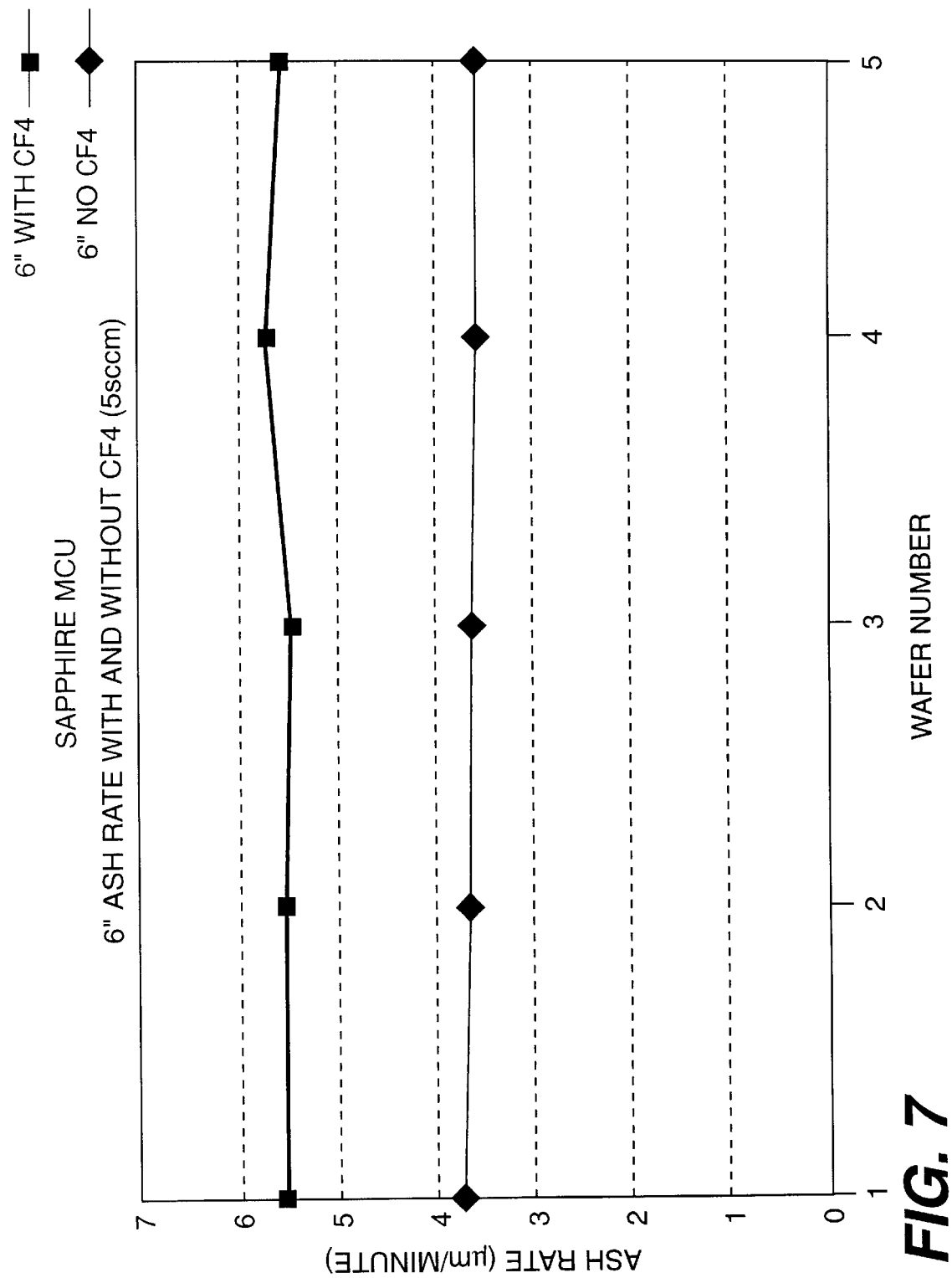

The results shown in FIG. 7 were achieved utilizing the same three steps as the processes shown in FIG. 6. However, the amounts of oxygen-containing compound(s) and forming gas supplied were about 1700 scam and about 300 scam, respectively. FIG. 7 shows the results for processes that included 5 sccm $CF_4$ or did not include $CF_4$ at all.

Figure 8:
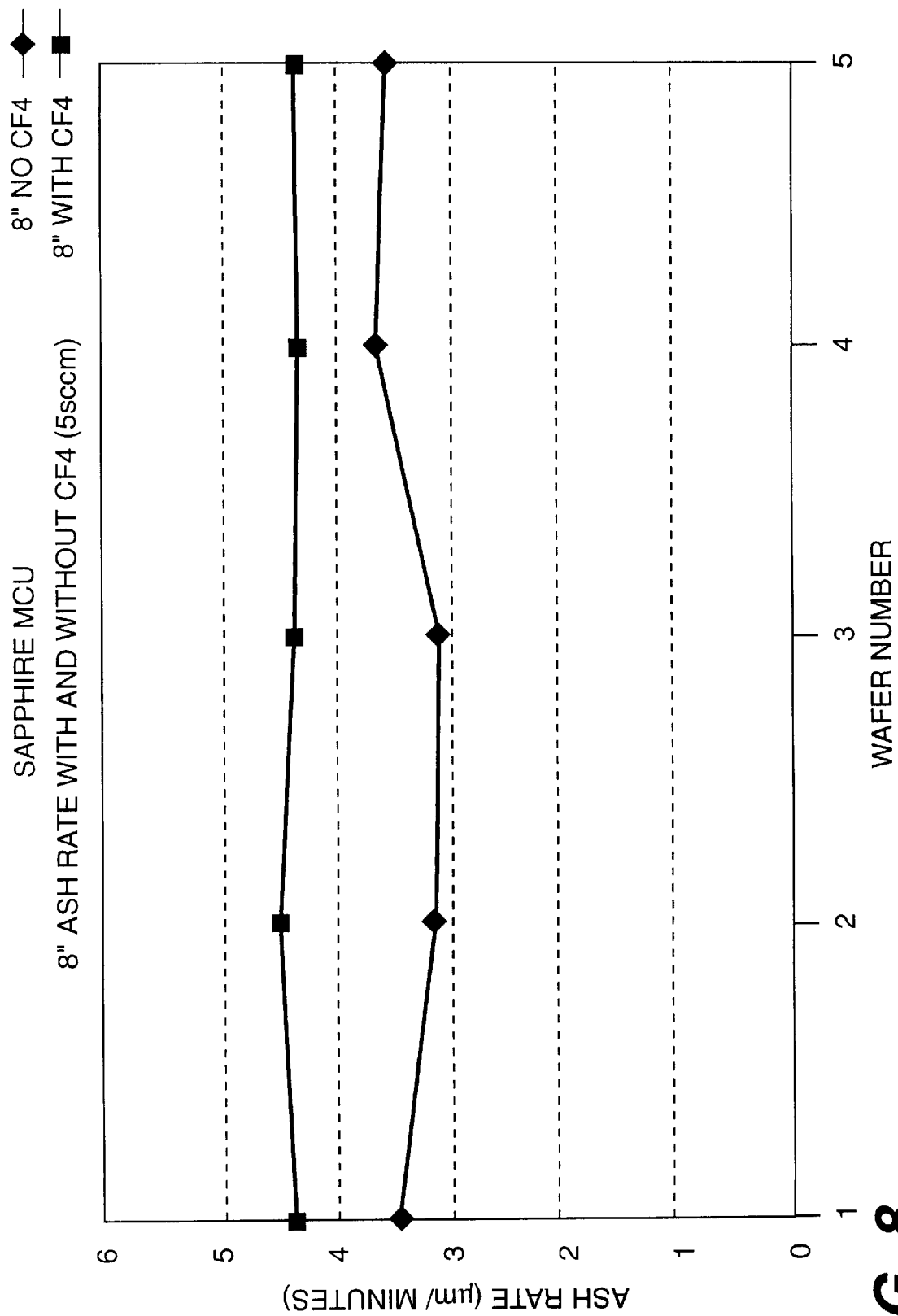

The results shown in FIG. 8 were achieved utilizing the same three steps as the processes shown in FIG. 6. However, the amounts of oxygen-containing compound(s) and forming gas supplied were about 2000 scam and about 300 scam, respectively, to compensate for a larger substrate being treated. FIG. 8 shows the results for processes that included 5 scam $CF_4$ or did not include $CF_4$ at all.

Figure 9:
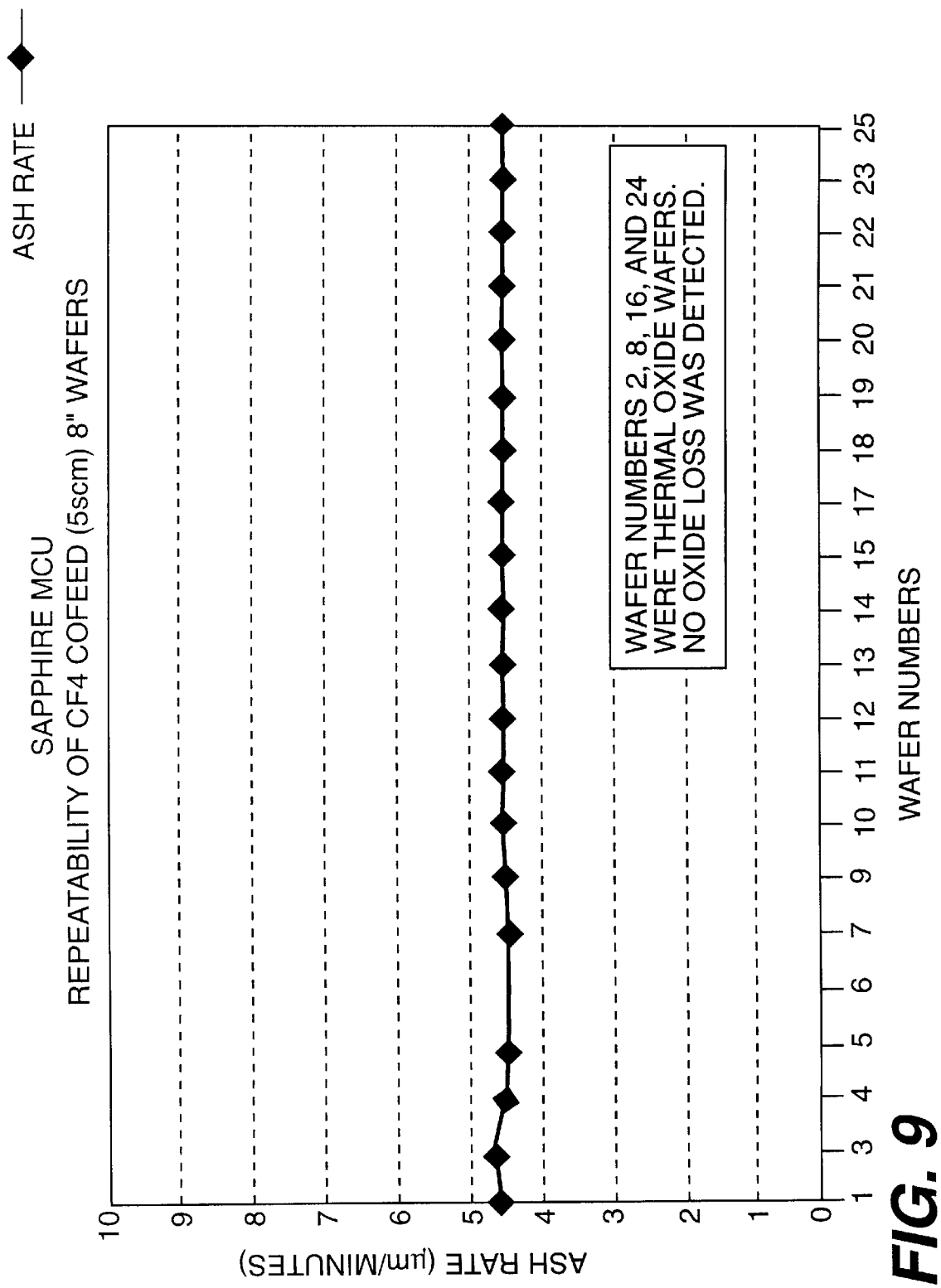
Figure 10:
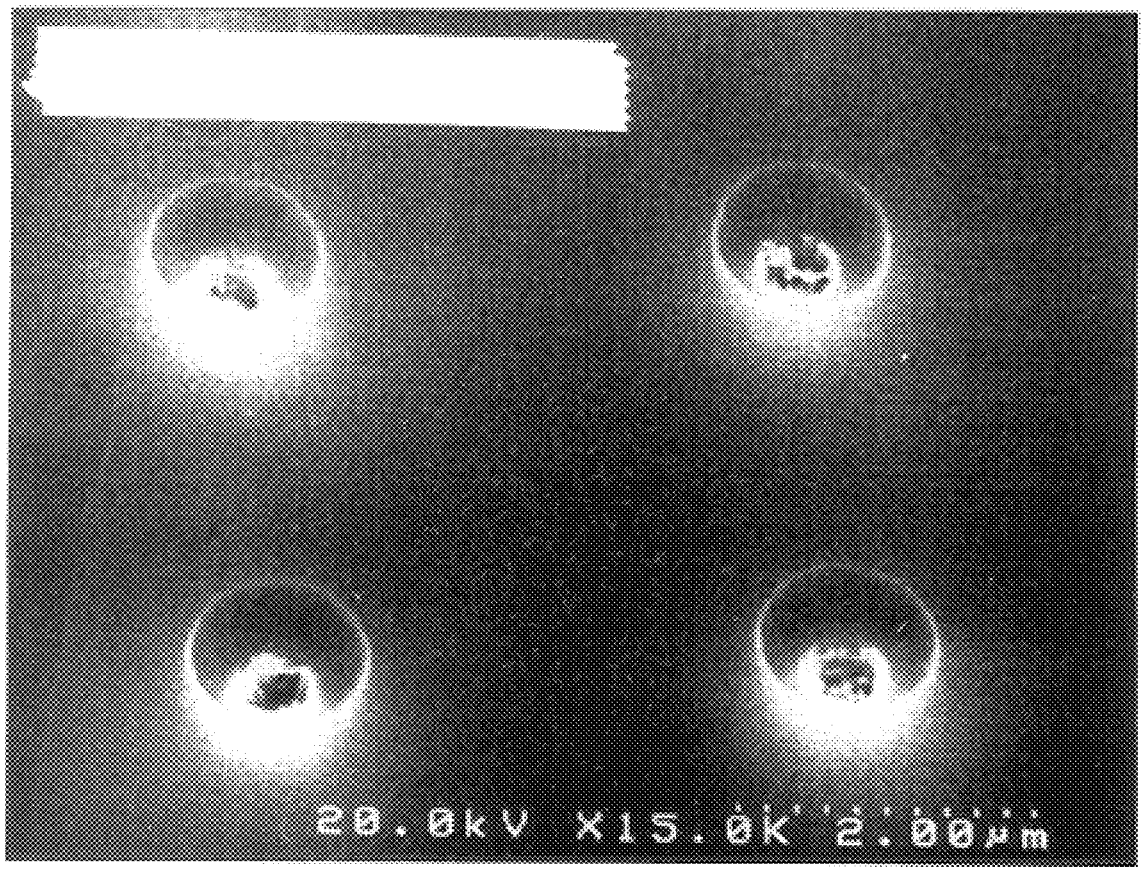
FIGS. 10–19 represent photomicrographic evidence of the results of embodiments of processes according to the present invention according to Example 3.
Figure 11:
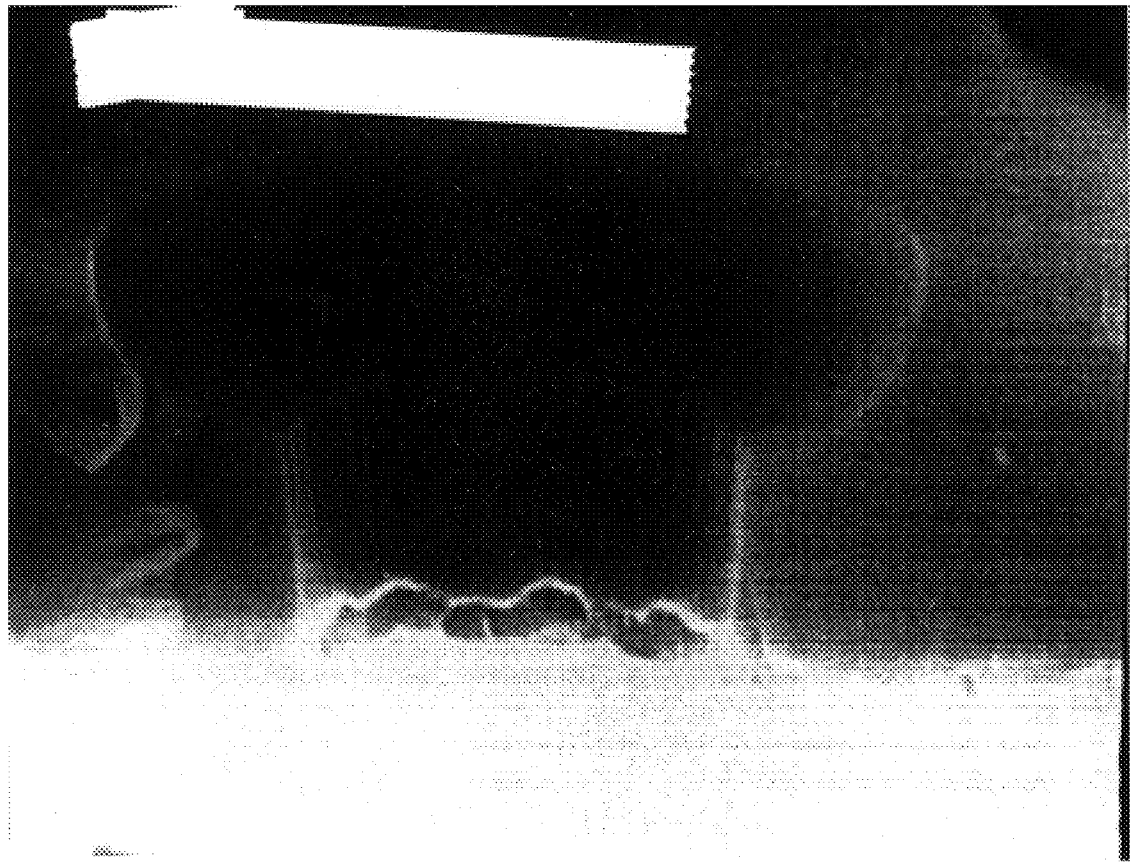
Figure 12:
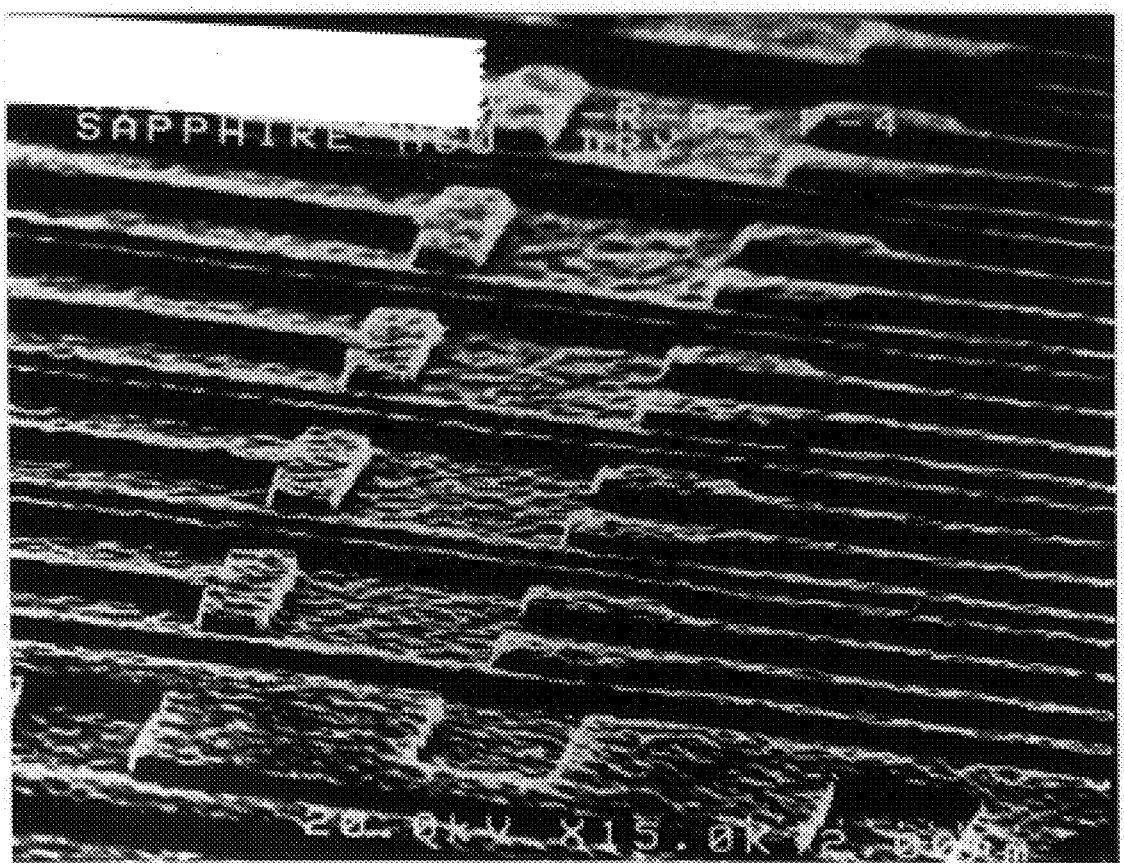
Figure 13:
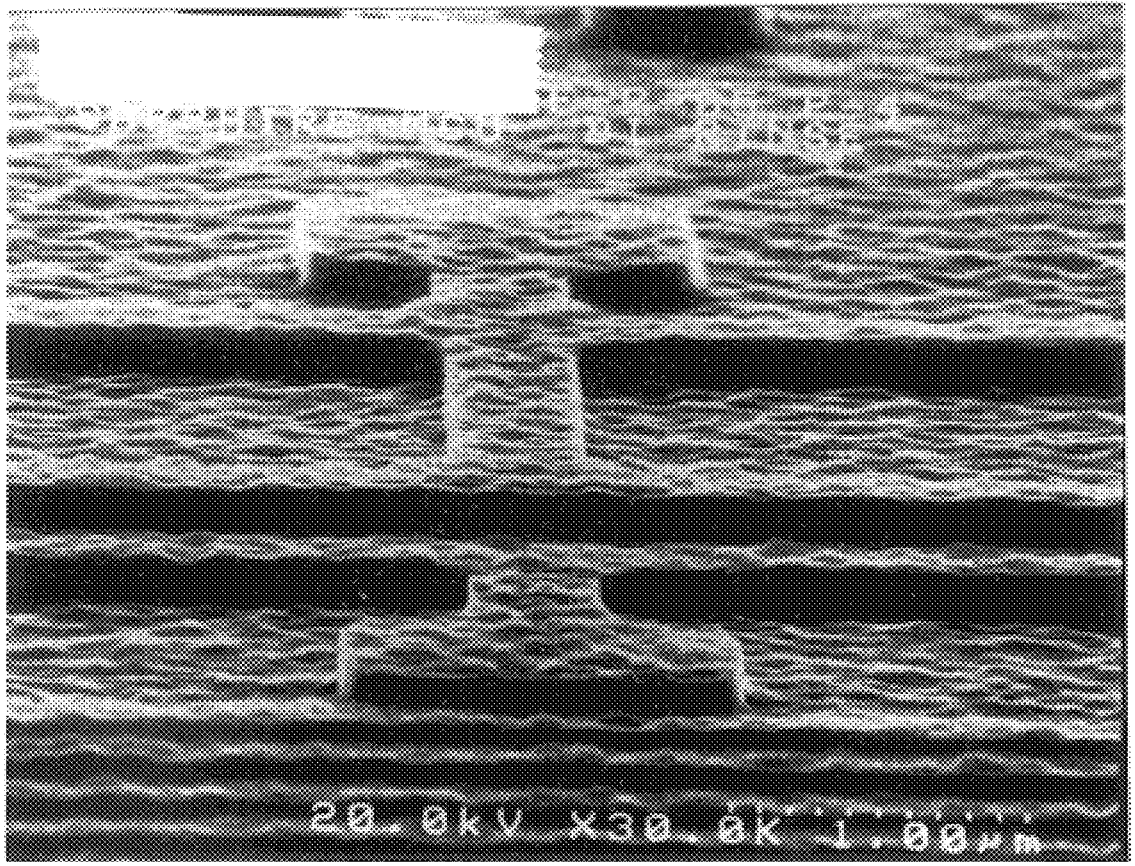
Figure 14:
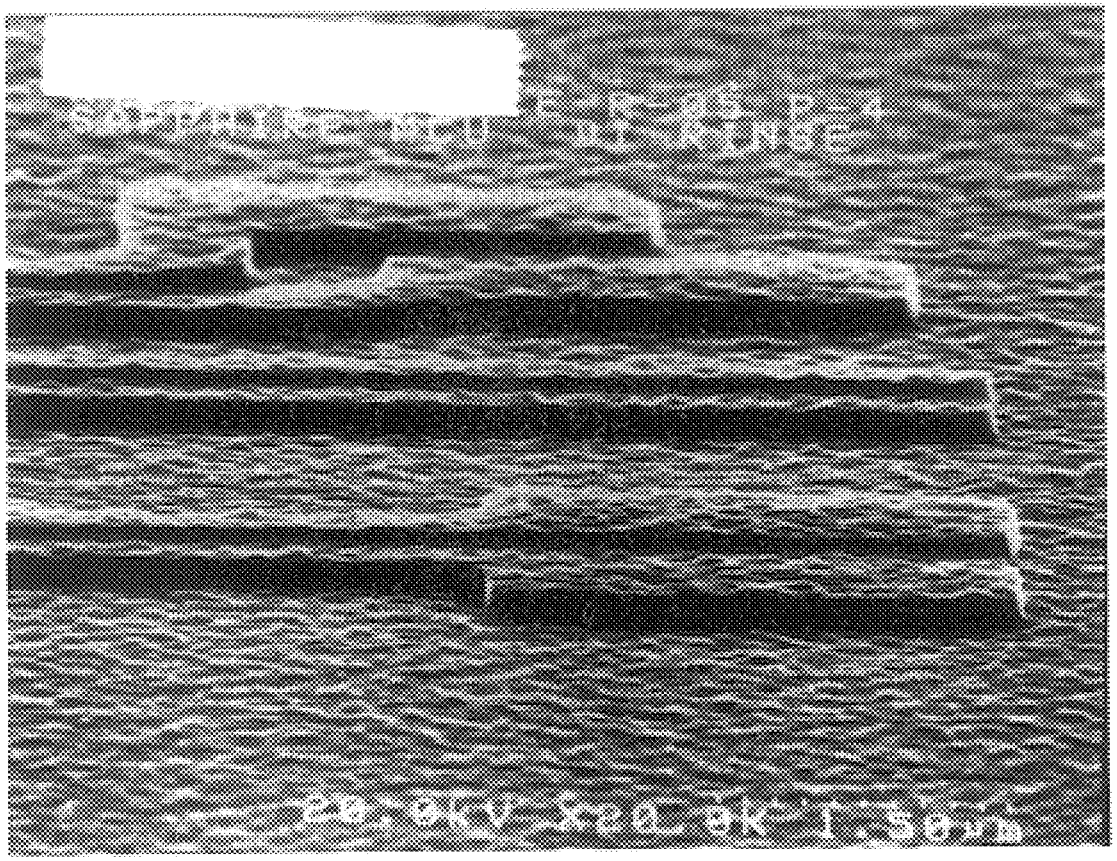
Figure 15:
Figure 16:
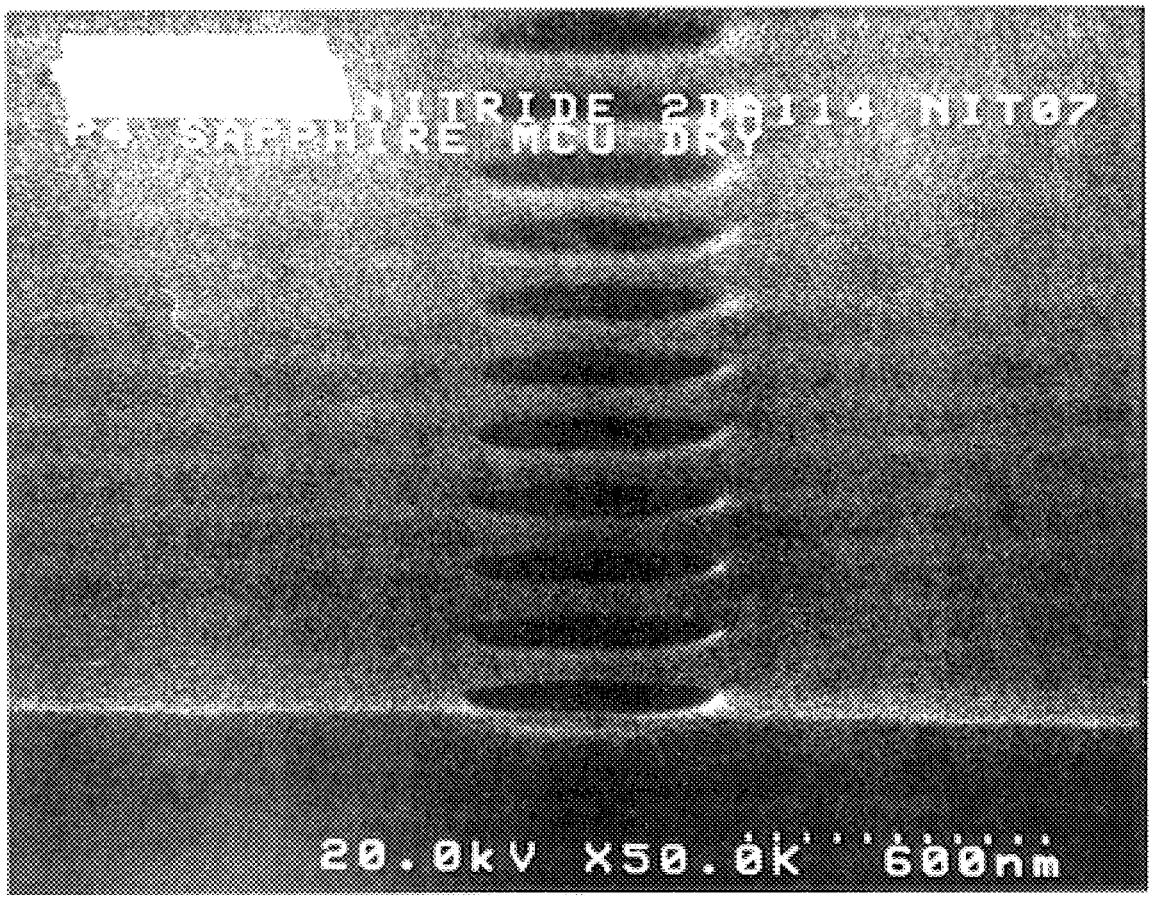
Figure 17:
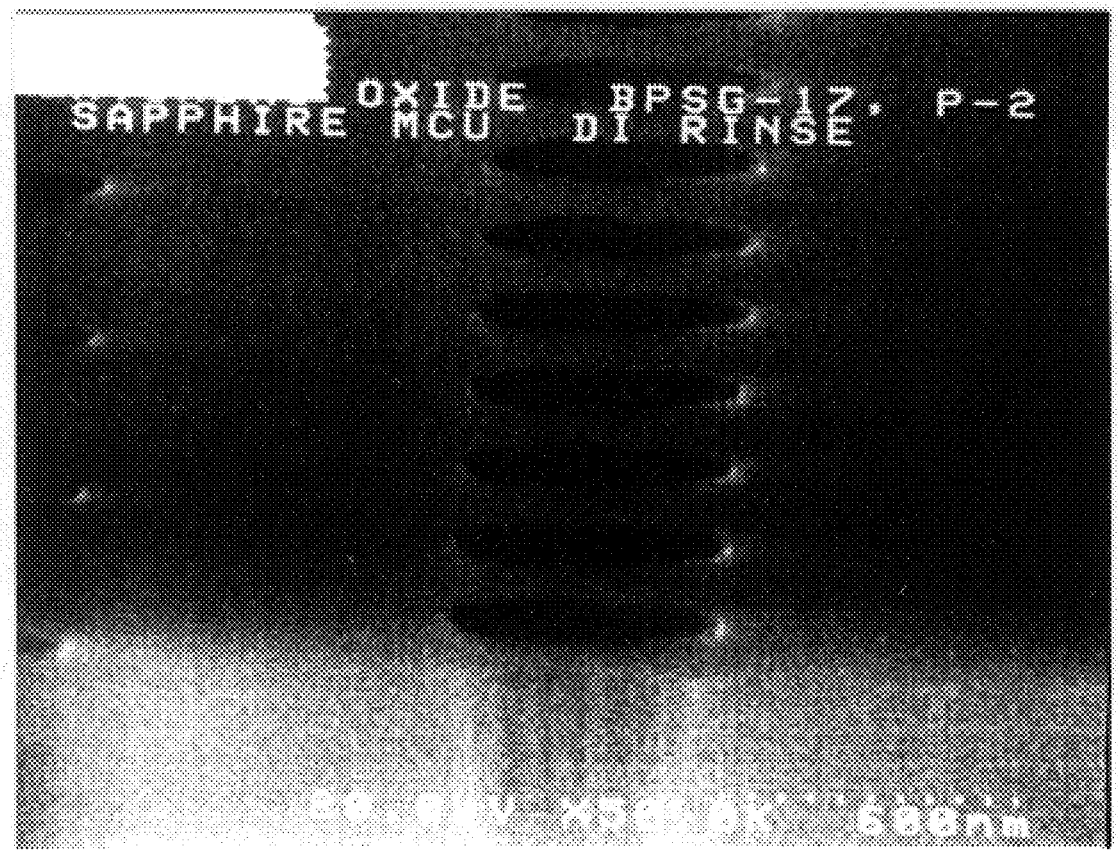
Figure 18:
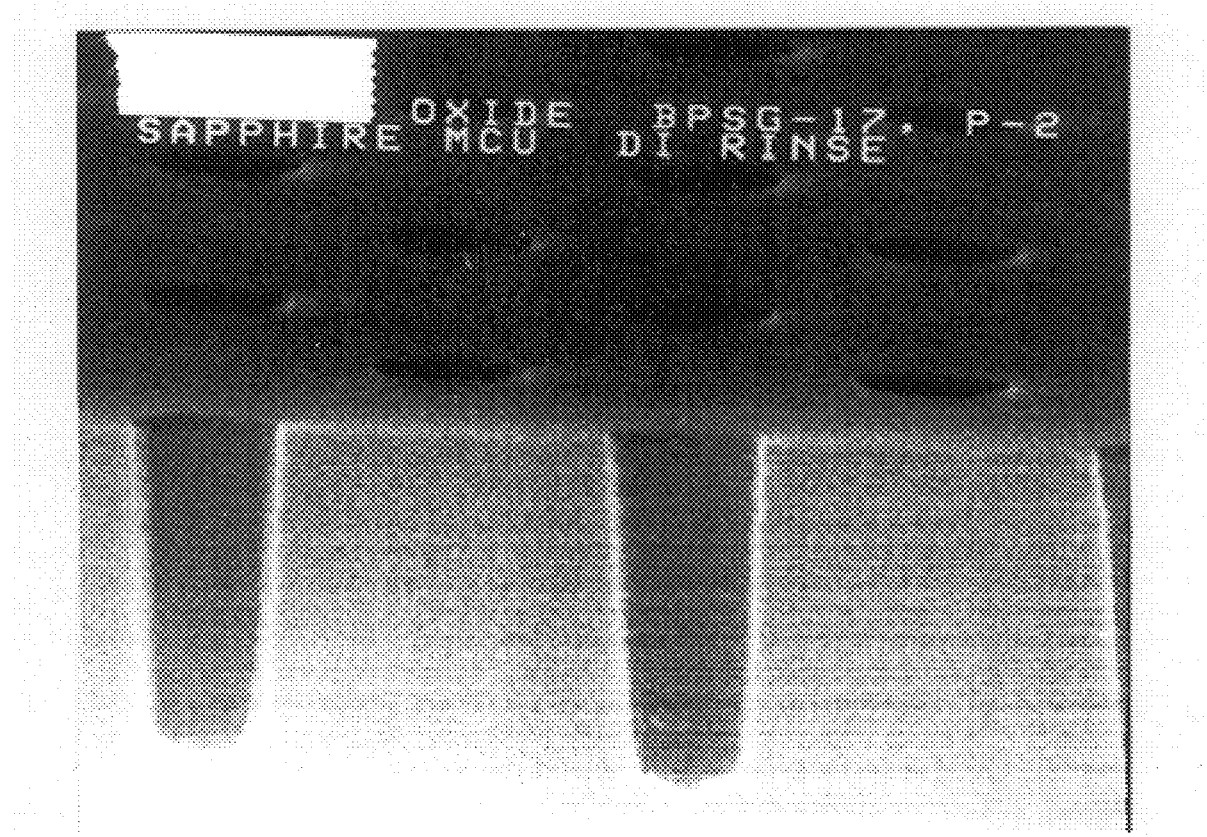
Figure 19:
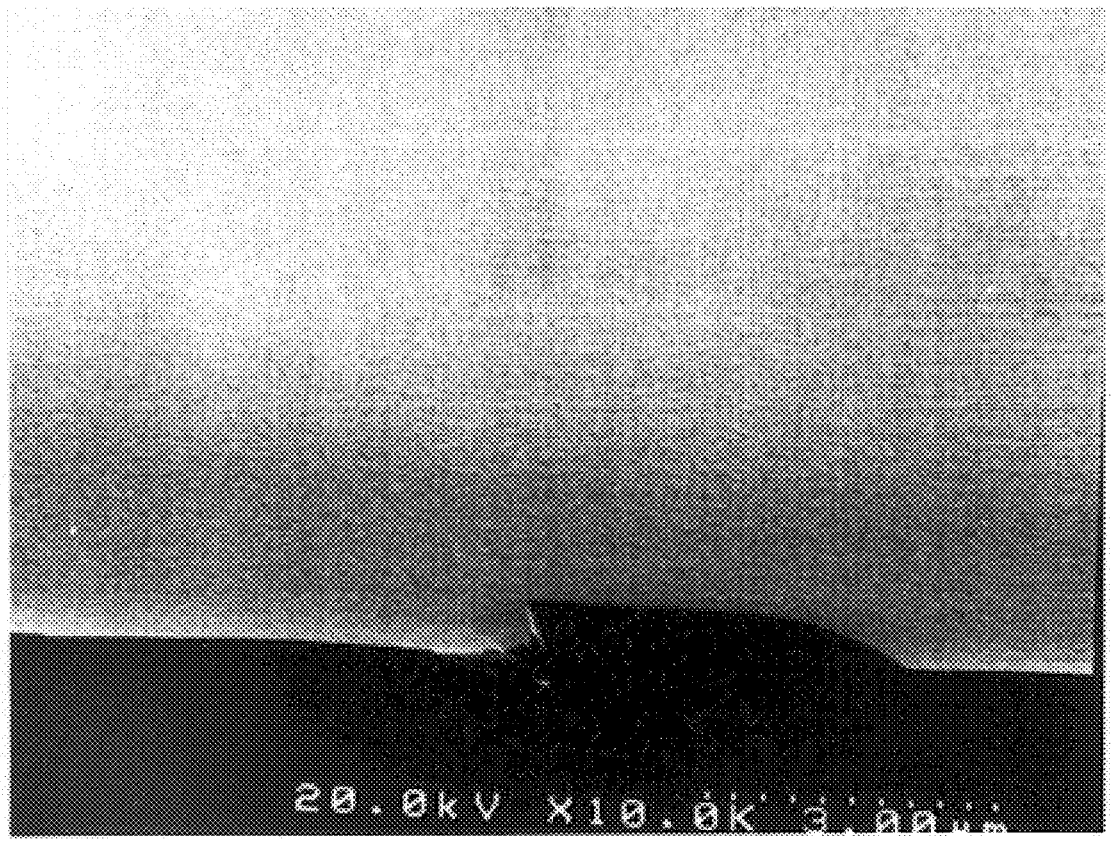

The results shown in FIG. 9 were achieved utilizing the same three steps as the processes shown in FIG. 6 and demonstrates the repeatability of the results over a plurality of substrates. However, the amounts of oxygen-containing compound(s), forming gas, and $CF_4$ supplied were about 2000 scam, about 300 scam, and about 5 scam, respectively.

Figure 20:
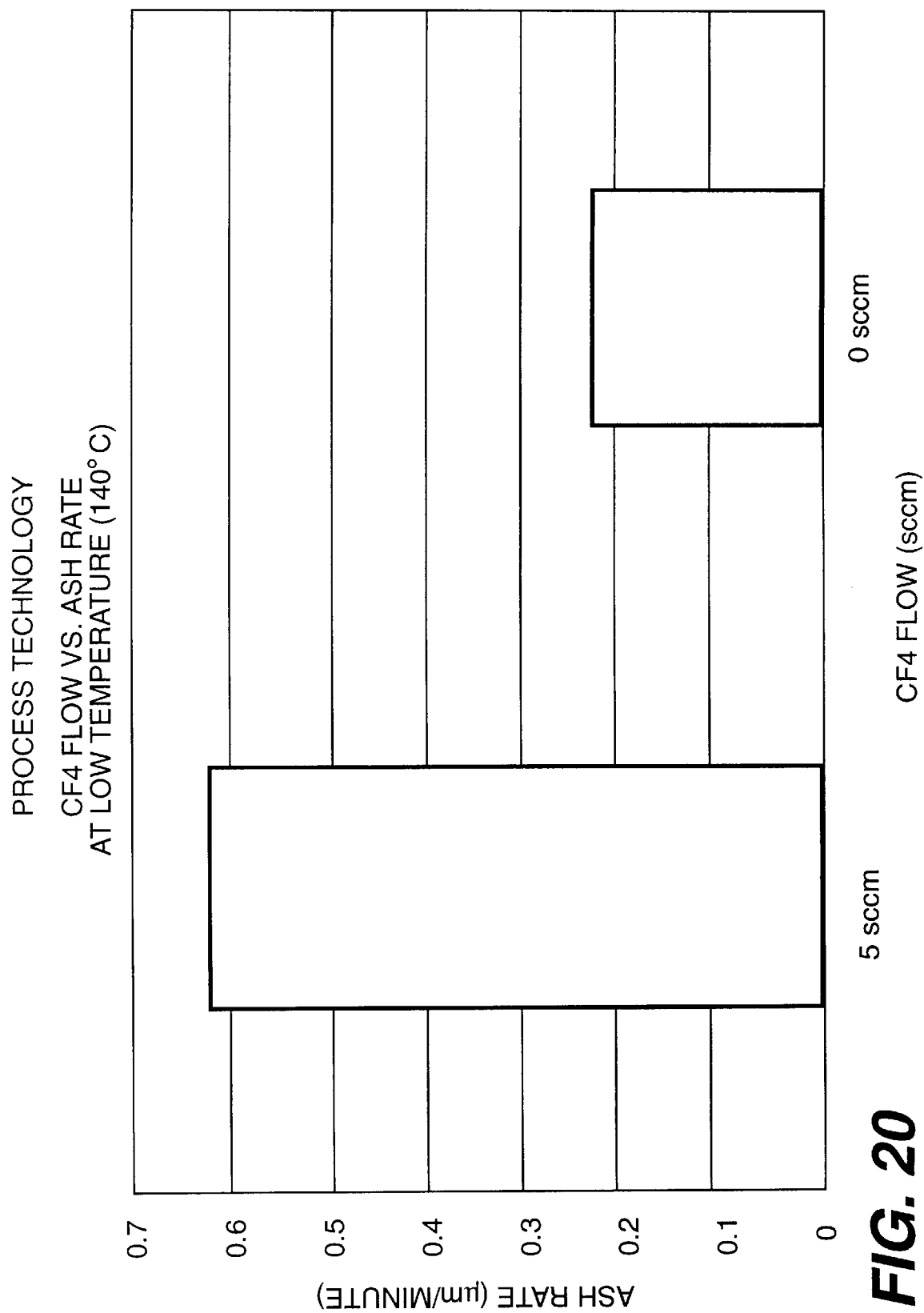
FIG. 20 represents a graph illustrating the advantage of the increased ash rate according to the present invention of adding a trickle of at least one fluorine-containing compound, in this case, $CF_4$, according to an embodiment of the present invention.
Figure 21:
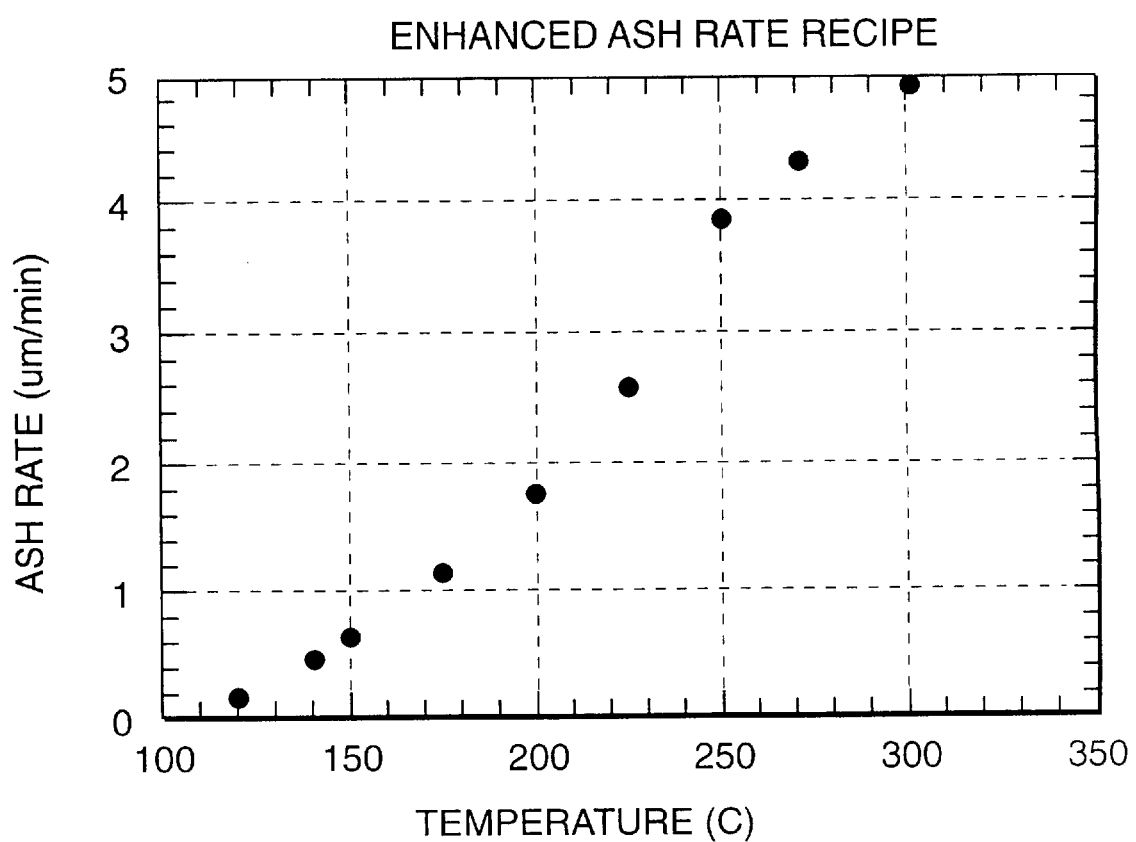
FIG. 21 represents a graph illustrating ash rate as a function of temperature utilizing another embodiment of the present invention.

FIG. 20 illustrates the advantage of the increased ash rate according to the present invention of adding a trickle of at least one fluorine-containing gas, in this case, $CF_4$, especially at lower temperatures. FIG. 21 illustrates temperature variation of ash rate while utilizing a 5 scam trickle of $CF_4$.

Figure 22:
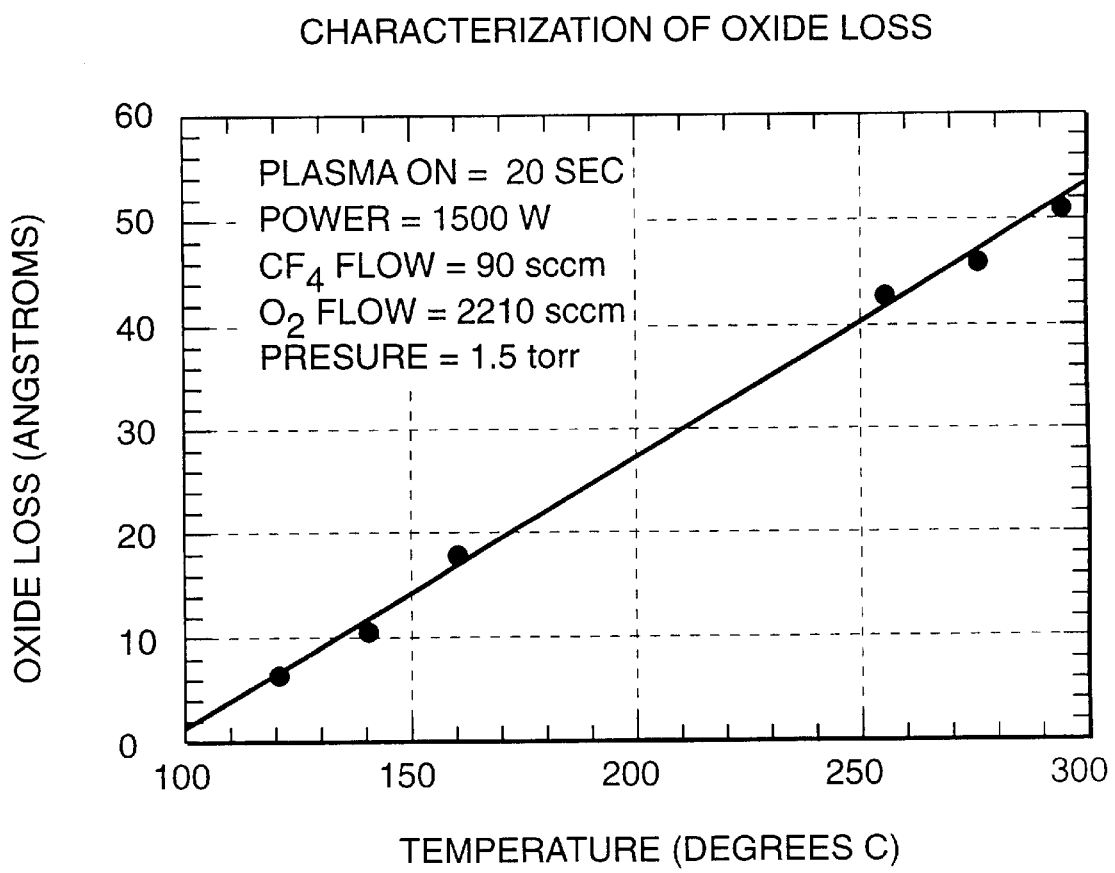
FIG. 22 represents a graph illustrating oxide loss as a function of temperature for one embodiment of a process according to the present invention.

FIG. 22 illustrates a characterization of oxide loss for a process that includes two treatment steps during which different process parameters were utilized. In the first step, the plasma generating and discharge device was turned on for a time sufficient for the device to reach a temperature of about 140° C. No power is provided to the plasma generating and discharge device. At least one fluorine-containing compound in the form of $CF_4$ is provided to the plasma generating and discharge device at a flow rate of about 300 sccm. At least one oxygen-containing compound in the form of $O_2$ is provided to the plasma generating and discharge device at a flow rate of about 1700 sccm. The pressure within the plasma generating and discharge device is about 1.5 torr.

According to the second step in the process whose results are shown in FIG. 22, the plasma generating and discharge device was turned on for about 20 seconds. About 1500 watts of power is provided to the plasma generating and discharge device. At least one fluorine-containing compound in the form of $CF_4$ is provided to the plasma generating and discharge device at a flow rate of about 90 sccm. At least one oxygen-containing compound in the form of $O_2$ is provided to the plasma generating and discharge device at a flow rate of about 2210 sccm. The pressure within the plasma generating and discharge device is about 1.5 torr.

Figure 23:
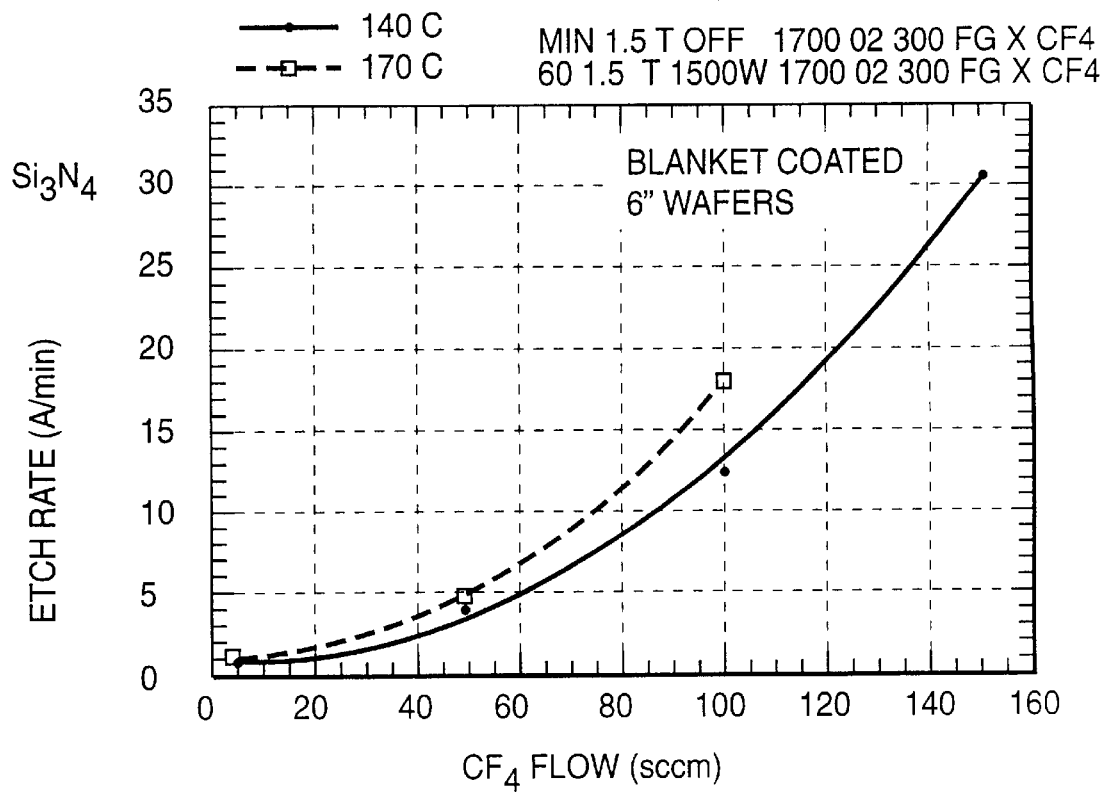
FIG. 23 represents a graph illustrating etch rate as a function of flow of CF4, utilized as a fluorine-containing compound, for one embodiment of a process according to the present invention.

FIG. 23 illustrates a characterization of nitride etch for a process that includes two treatment steps during which different process parameters were utilized. In the first step, the plasma generating and discharge device was turned on for a time sufficient for the device to reach a temperature of about 140° C. No power is provided to the plasma generating and discharge device. At least one fluorine-containing compound in the form of $CF_4$ is provided to the plasma generating and discharge device at a flow rate of about 300 sccm. At least one oxygen-containing compound in the form of $O_2$ is provided to the plasma generating and discharge device at a flow rate of about 1700 sccm. The pressure within the plasma generating and discharge device is about 1.5 torr.

According to the second step in the process whose results are shown in FIG. 23, the plasma generating and discharge device was turned on for about 60 seconds. The temperature within the plasma generating and discharge device was about 170° C. About 1500 watts of power was provided to the plasma generating and discharge device. At least one fluorine-containing compound in the form of $CF_4$ is provided to the plasma generating and discharge device at a flow rate of about 300 sccm. At least one oxygen-containing compound in the form of $O_2$ is provided to the plasma generating and discharge device at a flow rate of about 1700 sccm. The pressure within the plasma generating and discharge device is about 1.5 torr.

According to one example of a plasma generating and discharge device including a sapphire plasma tube that may be utilized in carrying out processes according to the present invention, microwave excitation electric field is utilized that is substantially uniform in the azimuthal and axial directions of the tube. Such a field will cause substantially equal heating of the tube in the azimuthal and longitudinal directions, thus obviating cracking.

The resultant azimuthal and longitudinal uniformity may be provided by modes including the rectangular $TM_{110}$ mode or the cylindrical $TM_{010}$ mode, or possibly by a combination of other modes, the resultant of which is the desired uniformity.

In order to create the conditions necessary to excite and support the rectangular $TM_{110}$ or cylindrical $TM_{010}$ modes, such that it is the dominant driven mode, it is necessary to use a relatively short microwave cavity. This would ordinarily dictate using a correspondingly short plasma tube. However, a problem caused by using a short plasma tube may be that the longitudinal temperature gradient is too great at the ends of the tube where there is a transition from inside the cavity, where there is a field, to outside the cavity where there is no field, thus causing cracking.

To solve this problem, a relatively long microwave structure is provided, which is divided into lengthwise sections by partitions. The plasma tube is fed through a hole in each partition, and thus runs the length of the microwave structure, while each of the lengthwise sections is separately fed with microwave energy. Each section thus appears to the incoming microwave energy to be a separate cavity of relatively short length, thus promoting the formation of the correct mode, while the plasma tube is relatively long, thus obviating any problems with cracking.

Microwave energy may be provided having an electric field which is substantially uniform in the azimuthal and axial directions of the tube. Such an electric field will heat the tube substantially uniformly in the azimuthal and axial directions of the tube, which will prevent or minimize the formation of temperature stresses due to unequal heating. As used herein, the term "azimuthal direction" applies to tubes having both circular and non-circular cross-sections, and means the direction which follows the periphery of the tube in a plane which is perpendicular to the axial direction.

Figure 31:
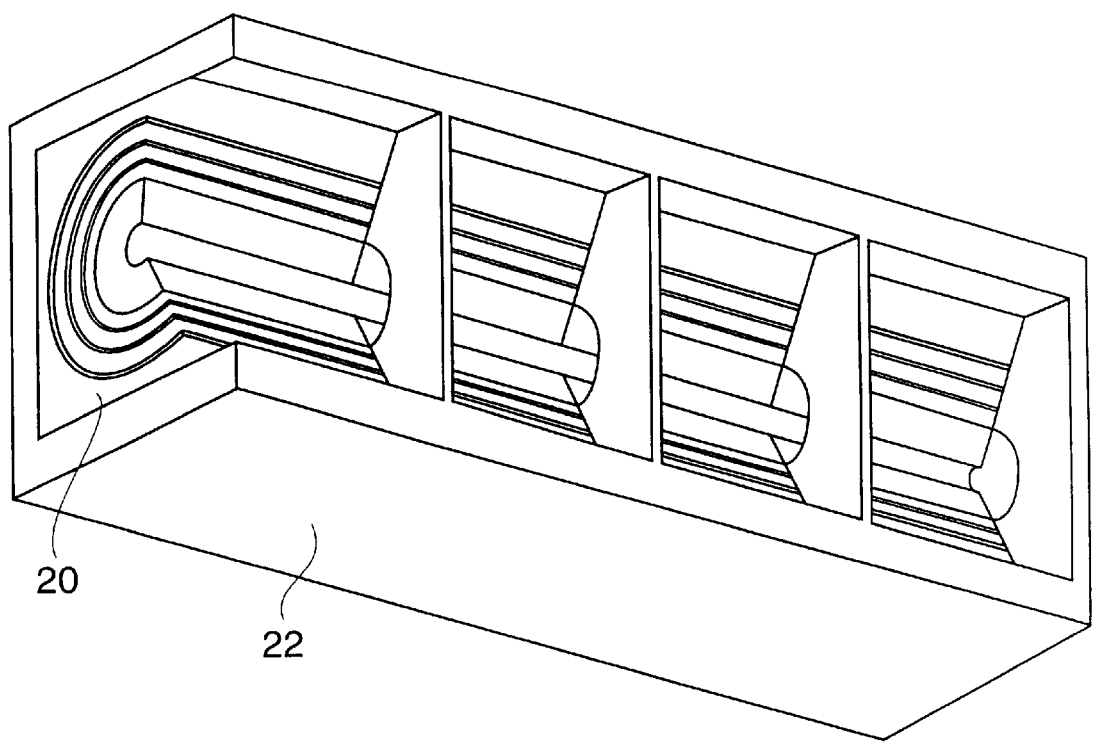
FIG. 31 represents a electric field intensity distribution in the rectangular $TM_{110}$ mode, which provides azimuthal and axial uniformity.

The rectangular $TM_{110}$ and circular $TM_{010}$ modes both provide substantial azimuthal and axial uniformity for a tube of circular cross-section. In FIG. 31, the idealized electric field intensity distribution for such modes are depicted (shown in rectangular cavity 22). The intensity distribution may be viewed as concentric cylinders having azimuthal and axial uniformity with the strength increasing towards the center. There is negligible variation in field strength over the relatively small radial dimension of the tube.

A relatively short cavity favors the formation of modes having azimuthal and axial uniformity, which suggests the use of a correspondingly short plasma tube. In a practical system, process etch rates are related to microwave input power. When an input power that attains an acceptable etch rate is used with a short plasma tube, the power density is such that an unacceptably large thermal gradient exists at the ends of the tube, which may cause cracking.

Figure 32:
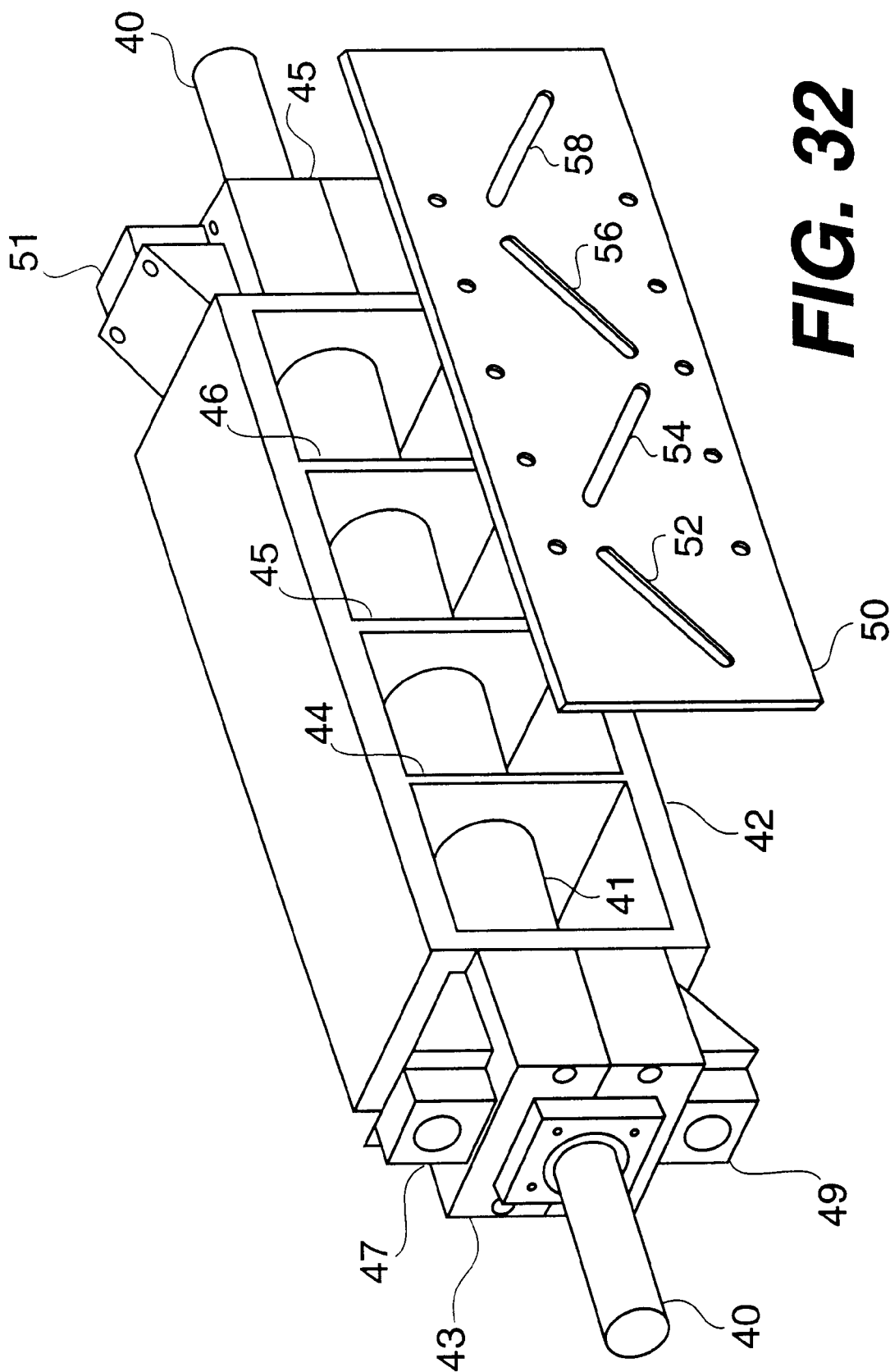
FIG. 32 represents a microwave structure that may be utilized for carrying out processes according to the present invention.

This problem is solved by using a microwave enclosure which is partitioned into lengthwise sections. Referring to FIG. 32, microwave enclosure 42 is a rectangular box which is partitioned into lengthwise sections by partitions 44, 45, and 46 having plasma tube 40 passing therethrough. While four sections are shown in the embodiment which is illustrated, fewer or more sections may be used. Each partition has an opening through which the plasma tube passes. Each section is separately fed with microwave energy. Thus, each section appears to be a relatively short cavity to the incoming microwave energy, promoting the formation of modes having azimuthal and axial uniformity, and preventing the formation of modes such as the $TE_{101}$, $TE_{102}$, etc., which do not. However, the total length of the plasma tube is relatively long, thus ensuring that the power density in the tube is such that the temperature gradient at the tube ends is within acceptable limits.

Outer tube 41 surrounds the plasma tube inside the cavity. The outer tube is slightly separated from the plasma tube, and air under positive pressure is fed between the two tubes to provide effective cooling of the plasma tube. Tube 41 would typically be made of quartz.

The openings in the partitions 44, 45, and 46 through which the concentric tubes are fed are made larger than the exterior dimension of the plasma tube. There is microwave leakage through such openings which causes a plasma to be excited in the part of the tube that is surrounded by the partition. Such leakage helps reduce thermal gradients in the plasma tube between regions surrounded by partitions and regions that are not. If an outer tube is not used (cooling provided in some other manner), the openings in the partitions are sized so that there is a space between the plasma tube and the partition to provide such microwave leakage. In the embodiment shown in FIG. 32, there is a space between the outer tube and the partition.

FIG. 32 also shows an iris plate 50 which covers the open side of the microwave structure, and is effective to feed microwave energy into the adjacent sections. Plate 50 is a flat metallic plate having irises 52, 54, 56 and 58, through which the microwave energy is fed.

The invention is applicable to devices where either the plasma or the afterglow from the plasma is used to remove material. Microwave traps 43 and 45 are provided at the ends to prevent microwave leakage. Such traps may be of the type disclosed in U.S. Pat. No. 5,498,308, which is incorporated herein by reference. Air seals/directional feeders 47 and 49 are provided for admitting cooling air and feeding it to the space between the concentric tubes. Air seal/directional feeder 51 is shown at the outlet end, and a fourth such unit is present, but is not seen.

Figure 33:
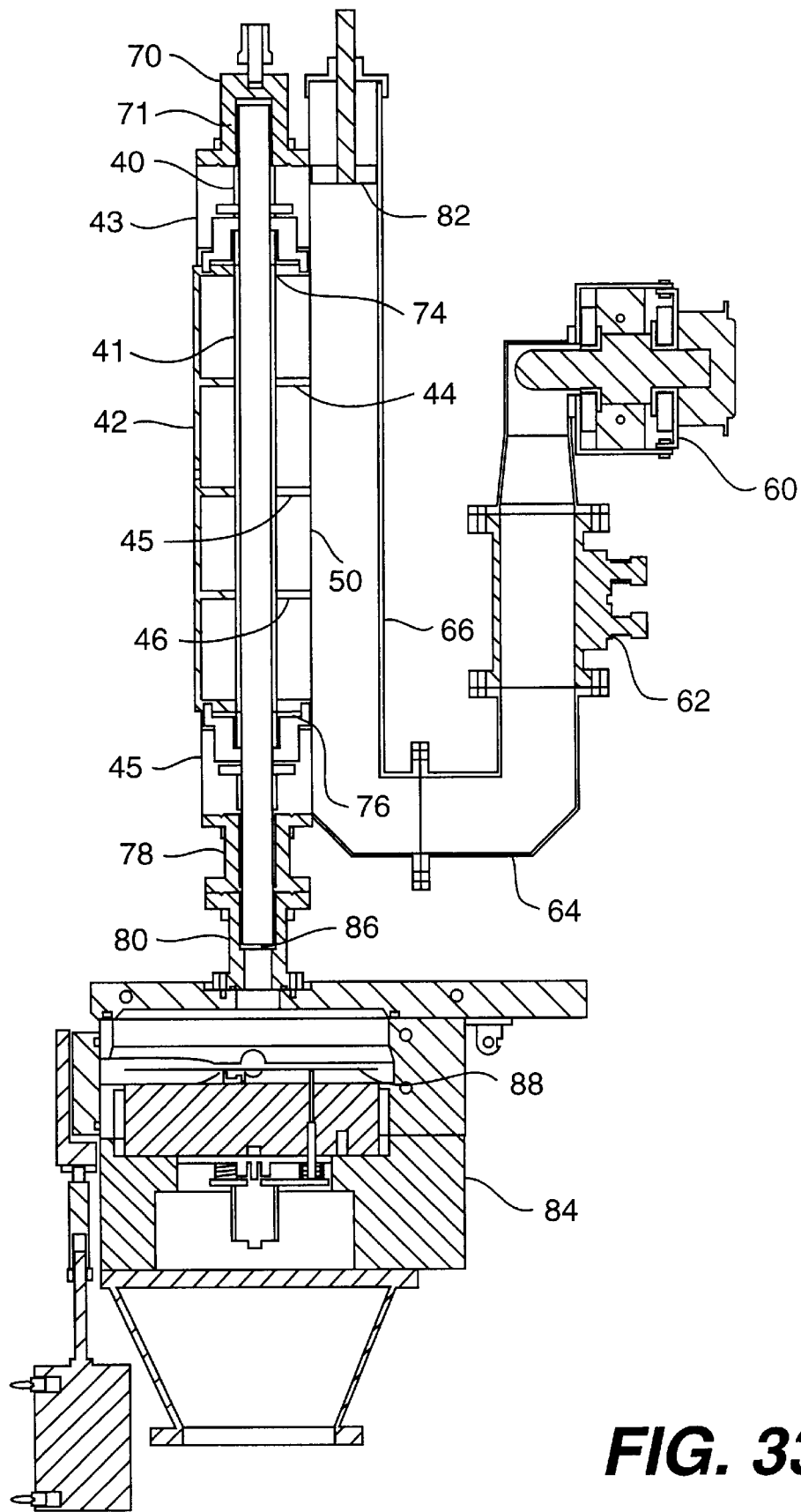
FIG. 33 and FIG. 34 illustrate a more complete device that may be utilized for carrying out processes according to the present invention.

FIG. 33 shows a more complete device as assembled. Magnetron 60 provides microwave power, which is fed through coupler 62 to a waveguide supplying a $TE_{10}$ mode, having mutually perpendicular sections 64 and 66. The length of waveguide section 66 is adjustable with moveable plunger 82. The bottom plate of waveguide section 66 in FIG. 33 is iris plate 50, which couples microwave energy into partitioned microwave structure 42, through which the plasma tube extends; thus, a plasma is excited in the gas flowing through the plasma tube.

Referring again to FIG. 33, it is seen that end cap 70 abuts microwave trap 43, and fitting 72 having a central orifice for admitting gas to the plasma tube extends into the end cap. The plasma tube is supported at this end by O ring 71 in the end cap. The outer tube 41 is supported at its ends by abutment against microwave traps 43 and 45. Spacer 78 is present to provide the proper spacing in relation to the process chamber. The other end of the plasma tube is located in end member 80, and has an orifice 86 for emitting gas into the process chamber.

The process chamber 84 includes retractable wafer support pins 90 and 91, which support wafer 88, to be processed. Chuck 92 is for providing the correct heating to the wafer during processing. One or more baffle plates may be present above the wafer to promote even distribution of the gas.

Figure 34:
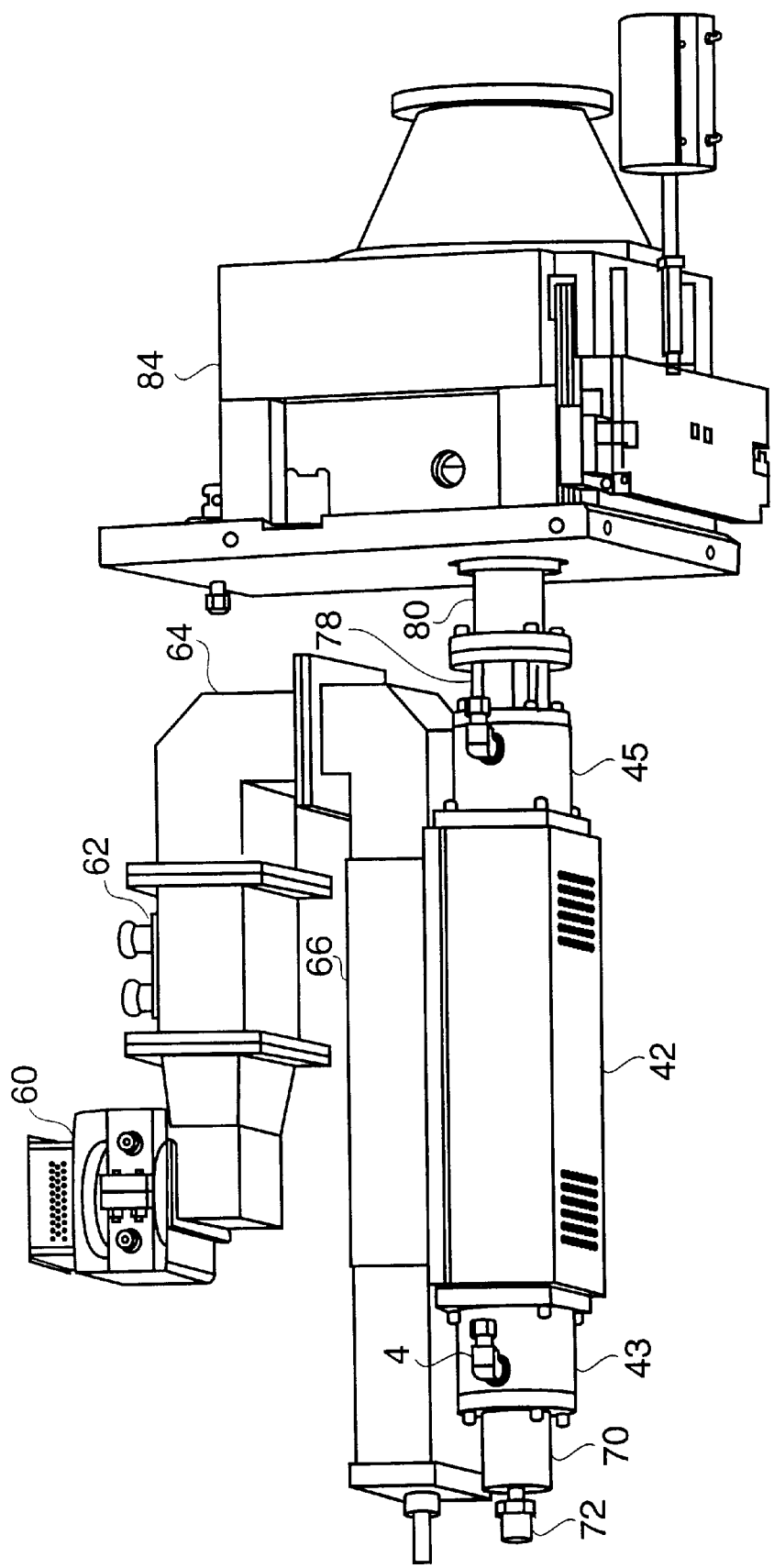

Referring to FIG. 33, an exterior view of the device is shown. The reference numerals in FIG. 34 correspond to those which are in the other Figures.

In the preferred embodiment, microwave enclosure 42 is dimensioned to support the rectangular $TM_{110}$ mode and the enclosure 42 may have a square cross section. The dimensions of the cross sections are such that the $TM_{110}$ mode is resonant. The length of each section is less than $\lambda_g/2$ where $\lambda_g$ is the guide length within the cavity of the $TE_{104}$ mode.

In an actual embodiment which was built, the magnetron frequency was 2443 MHz, the microwave enclosure was 3.475–3.5 inches on each side, and the length of each of four sections was 2.875 inches. A sapphire tube having an ID of about 0.900" and an OD of about 1.000" was used, and a gas of 85% $O_2$, 5% He, 10% $NF_3$ was flowed through the tube for removing residue of polymeric materials in the form of veils which are caused by over etching. The power density was about 36 watts/in$^3$.

As discussed above, the example of a plasma generating and discharge device including a sapphire plasma tube described herein finds a particular use with plasma tubes which are made of a material which is inclined to crack when heated unequally. One example of such materials are those having a linear thermal expansion coefficient greater than $7 \times 10^{-7}/K°$ at operating temperature. However, the example of a plasma generating and discharge device including a sapphire plasma tube may also be used with other plasma tubes made of other material, for example those made of quartz, as the uniform field will tend to keep the plasma off the tube wall and may provide improved lifetime of the quartz.

A quartz tube may be used with at least one fluorine-containing gas by coating the inside of the tube with a fluorine resistant coating such as $Al_2O_3$, $CaF_2$, fluorosilicade glasses AlN, or other fluorine resistant coating.

EXAMPLE 1

Example 1, on the following page, describes the treatment of photoresist on nitride to be stripped using a process according to the present invention. The Example includes four different processes described in four tables, labeled 1–4. Each process includes three process steps.

Example 1

Demonstration of nitride level strip
ES Asher

1.

| Time(sec) | Temp.(deg. C) | Press. (torr) | Power(watts) | $O_2$(sccm) | $N_2H_2$(sccm) | $CF_1$ |
|---|---|---|---|---|---|---|
| MIN | 270 | 1.5 | 2000 | 2000 | 300 | 8 |
| 60 | 270 | 1.5 | 2000 | 2000 | 300 | 8 |
| 20 | 270 | 1.5 | 2000 | 2000 | 300 | 8 |

MIN: minimum time needed to reach said temperature (18 sec)

2.

| Time(sec) | Temp.(deg. C) | Press. (torr) | Power(watts) | $O_2$(sccm) | $N_2H_2$(sccm) | $CF_1$ |
|---|---|---|---|---|---|---|
| MIN | 175 | 1.5 | 1500 | 2000 | 300 | 5 |
| 60 | 175 | 1.5 | 1500 | 2000 | 300 | 5 |
| 20 | OFF | 1.5 | 1250 | 2185 | 0 | 115 |

MIN: 7 sec

3.

| Time(sec) | Temp.(° C.) | Press. (torr) | Power(watts) | $O_2$(sccm) | $N_2H_2$(sccm) | $CF_4$ |
|---|---|---|---|---|---|---|
| MIN | 175 | 1.5 | 2000 | 2000 | 300 | 8 |
| 60 | 175 | 1.5 | 2000 | 2000 | 300 | 8 |
| 20 | OFF | 1.5 | 1250 | 2185 | 0 | 115 |

4.

| Time(sec) | Temp.(° C.) | Press. (torr) | Power(watts) | $O_2$(sccm) | $N_2H_2$(sccm) | $CF_4$ |
|---|---|---|---|---|---|---|
| MIN | 175 | 1.5 | 2000 | 2000 | 300 | 8 |
| 60 | 175 | 1.5 | 2000 | 2000 | 300 | 8 |
| 20 | 175 | 1.5 | 1500 | 2000 | 300 | 8 |

EXAMPLE 2

Example 2 describes a plurality of different processes performed utilizing a plurality of different process steps, to optimize residue removal while preventing undercuts and minimizing oxide loss.

EXAMPLE 2

Process 1) 10% CF4
Wafer number 15
14
13
12

| Time (sec) | Pressure (torr) | Temp. (° C.) | Power (watts) | O2 (sccm) | CF4 (sccm) | H2N2 (sccm) | CF4 (sccm)** |
|---|---|---|---|---|---|---|---|
| Min* | 1.5 | 140 | 1500 | 2000 | Off | 300 | 5 |
| 120 | 1.5 | 140 | 1500 | 2000 | Off | 300 | 5 |
| 20 | 1.5 | Off | 1000 | 2070 | 230 | Off | Off |

*Minimum time to reach required temperature
**A 50 sccm MFC installed

-continued

| Wafer | Oxide Loss (Å) |
|---|---|
| 1 | 21 |
| 2 | 33 |
| 3 | 33 |
| 4 | 32 |

Process 2) 5% CF4
Wafer number 11
10
9
8

| Time (sec) | Pressure (torr) | Temp. (° C.) | Power (watts) | O2 (sccm) | CF4 (sccm) | H2N2 (sccm) | CF4 (sccm)** |
|---|---|---|---|---|---|---|---|
| Min* | 1.5 | 140 | 1500 | 2000 | Off | 300 | 5 |
| 120 | 1.5 | 140 | 1500 | 2000 | Off | 300 | 5 |
| 20 | 1.5 | Off | 1250 | 2185 | 115 | Off | Off |

*Minimum time to reach required temperature
**A 50 sccm MFC installed

| Wafer | Oxide Loss (Å) |
|---|---|
| 1 | 14 |
| 2 | 15 |
| 3 | 13 |
| 4 | 17 |
| 5 | 17 |
| 6 | 17 |

Process 3) 4% CF4
Wafer number 7
6
4

| Time (sec) | Pressure (torr) | Temp. (° C.) | Power (watts) | O2 (sccm) | CF4 (sccm) | H2N2 (sccm) | CF4 (sccm)** |
|---|---|---|---|---|---|---|---|
| Min* | 1.5 | 140 | 1500 | 2000 | Off | 300 | 5 |
| 120 | 1.5 | 140 | 1500 | 2000 | Off | 300 | 5 |
| 20 | 1.5 | Off | 1500 | 2210 | 90 | Off | Off |

*Minimum time to reach required temperature
**A 50 sccm MFC installed

| Wafer | Oxide Loss (Å) |
|---|---|
| 1 | 11 |
| 2 | 13 |
| 3 | 12 |
| 4 | 16 |
| 5 | 11 |
| 6 | 15 |

EXAMPLE 3

Example 3 includes five processes carried out on a Fusion Gemini Enhanced Strip tool. Example 3 shows effective ash processes for via, poly, oxide, and nitride process levels. Gemini Enhanced Strip processes were demonstrated for these process levels that effectively eliminate a wet strip step and may require, if necessary, only dry ash followed by a deionized water (DI) rinse.

A Gemini Enhanced Strip (GES) process was developed for the ion implant process level that removes all photoresist and implant residue using only the dry ash followed by about a five minute DI rinse. No photoresist poppers were seen on the sample or in the chamber.

Descum recipes were demonstrated that removed about 530 Å. It may be possible to fine tune the process recipes to even further improve the results. However, the process would basically remain the same as described herein. The processes may also be shortened to improve total wafer throughput.

FIGS. 10–19 show photomicrographic evidence of the results of the processes according to Example 3.

EXAMPLE 3

1.

| Time (sec) | Pressure (torr) | Temp. (deg. C) | Power (watts) | O2 flow (sccm) | CF4 flow (sccm) | N2/H2 flow (sccm) | CF4 flow (sccm) |
|---|---|---|---|---|---|---|---|
| MIN | 1.5 | 120 | 1500 | 2000 | 0 | 300 | 8 |
| 45 | 1.5 | 120 | 1250 | 2185 | 210 | 0 | 8 |
| MIN | 1.5 | 270 | 1500 | 2000 | 0 | 300 | 0 |
| 15 | 1.5 | 270 | 1500 | 2000 | 0 | 300 | 0 |

2.

| Time (sec) | Pressure (torr) | Temp. (deg. C) | Power (watts) | O2 flow (sccm) | CF4 flow (sccm) | N2/H2 flow (sccm) | CF4 flow (sccm) |
|---|---|---|---|---|---|---|---|
| MIN | 1.5 | 140 | 1500 | 2000 | 0 | 300 | 5 |
| 120 | 1.5 | 140 | 1500 | 2000 | 0 | 300 | 5 |
| 20 | 1.5 | OFF | 1000 | 2070 | 210 | 0 | 8 |

3.

| Time (sec) | Pressure (torr) | Temp. (deg. C) | Power (watts) | O2 flow (sccm) | CF4 flow (sccm) | N2/H2 flow (sccm) | CF4 flow (sccm) |
|---|---|---|---|---|---|---|---|
| MIN | 1.5 | 175 | 2000 | 2000 | 0 | 300 | 8 |
| 60 | 1.5 | 175 | 2000 | 2000 | 0 | 300 | 8 |
| 20 | 1.5 | OFF | 1250 | 2185 | 115 | 0 | 0 |

4.

| Time (sec) | Pressure (torr) | Temp. (deg. C) | Power (watts) | O2 flow (sccm) | CF4 flow (sccm) | N2/H2 flow (sccm) | CF4 flow (sccm) |
|---|---|---|---|---|---|---|---|
| MIN | 1.5 | 175 | 1500 | 2000 | 0 | 300 | 8 |
| 60 | 1.5 | 175 | 1500 | 2000 | 0 | 300 | 8 |
| 20 | 1.5 | OFF | 1250 | 2185 | 115 | 0 | 0 |

5.

| Time (sec) | Pressure (torr) | Temp. (deg. C) | Power (watts) | O2 flow (sccm) | CF4 flow (sccm) | N2/H2 flow (sccm) | CF4 flow (sccm) |
|---|---|---|---|---|---|---|---|
| MIN | 1.5 | 140 | 1500 | 2000 | 0 | 300 | 5 |
| 30 | 1.5 | 140 | 1500 | 2000 | 0 | 300 | 5 |
| MIN | 1.5 | 300 | 1500 | 2000 | 0 | 300 | 5 |
| 60 | 1.5 | 300 | 1500 | 2000 | 0 | 300 | 5 |

EXAMPLE 4

Example 4 includes another process combination according to the present invention for removing material from a substrate.

Figure 24:
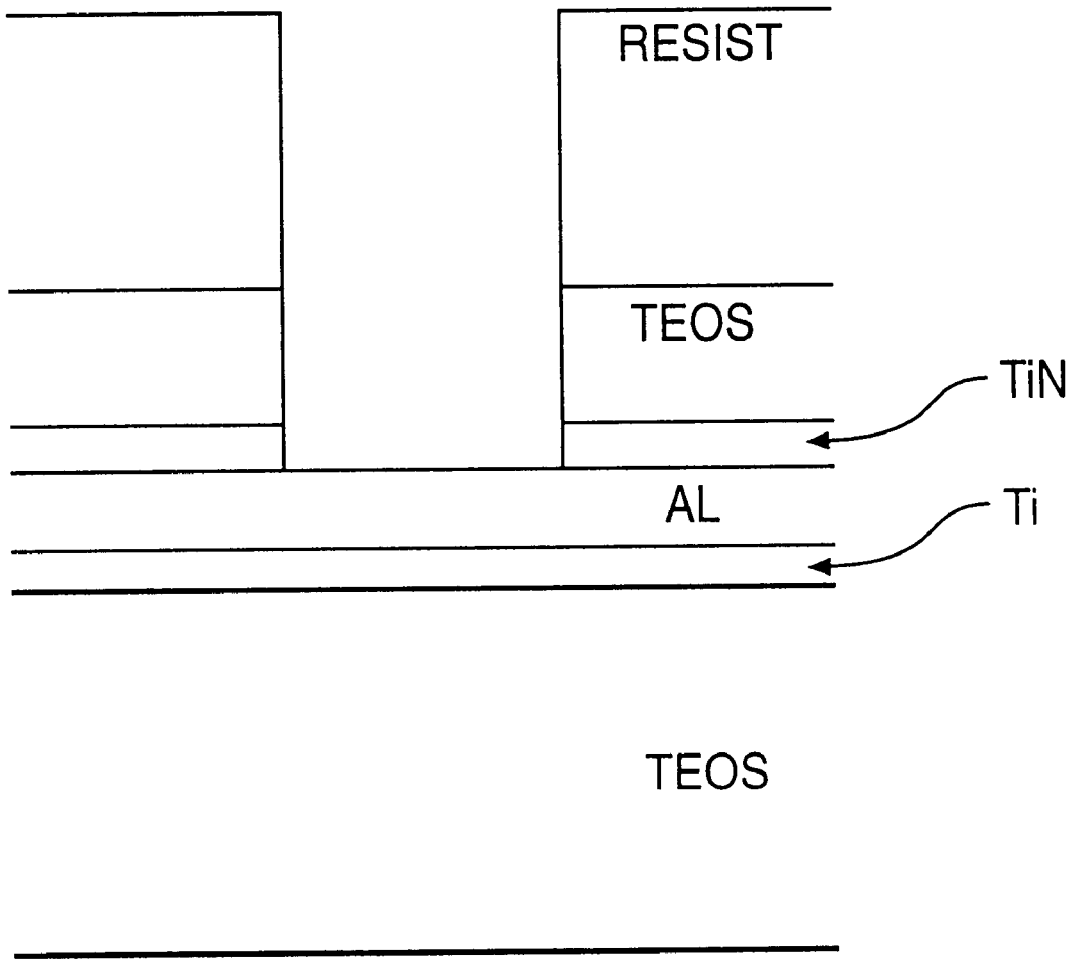
FIG. 24 represents a cross-sectional view of a typical via structure.
Figure 26A:
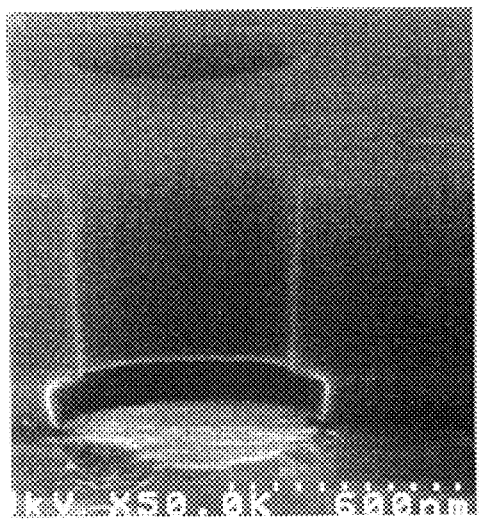
FIG. 26a represents a photomicrograph illustrating a via after treatment with a process according to the present invention similar to the process described in Example 4, illustrating undercutting.
Figure 26B:
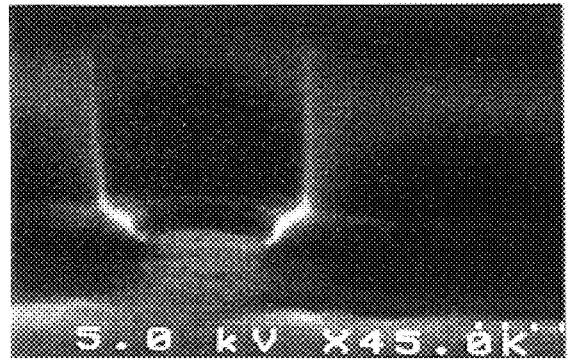

FIG. 26a and FIG. 26b illustrate vias that have been treated with a process including parameters substantially similar to those of Example 4. FIG. 24 illustrates a cross-sectional view of a typical via structure similar to the vias shown in FIG. 26a and FIG. 26b and treated according to the present invention. FIG. 26a illustrates undercut of the TiN layer in the substrate. FIG. 26b illustrates a via that by reducing the treatment time by about 15 seconds from that shown in Example 4, the undercutting may be eliminated.

Figure 25A:
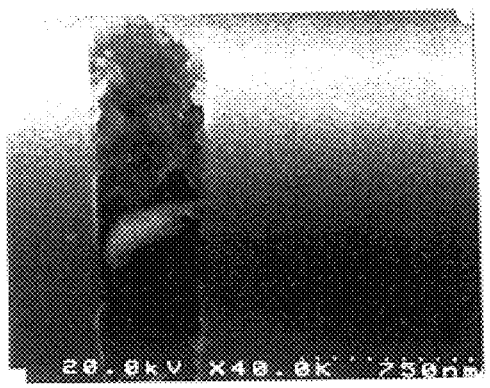
FIG. 25a represents a photomicrograph illustrating a post-etch via prior to treatment with a process according to the present invention.
Figure 25B:
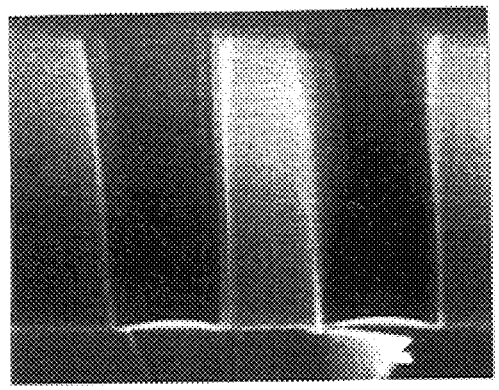
FIG. 25b represents a photomicrograph illustrating a via after treatment with a process according to the present invention.

FIG. 25a illustrates a via prior to treatment with the process of Example 4. As can be seen in FIG. 25a, debris remains in the via. On the other hand, FIG. 25b represents vias after treatment with a process according to Example 4 followed by a deionized water rinse.

EXAMPLE 4

| Step | Time (sec) | Pressure (torr) | Temp. (deg. C) | Power (watts) | $O_2$ flow (sccm) | $CF_4$ flow (sccm) | FG flow (sccm) |
|---|---|---|---|---|---|---|---|
| 1 | 75 | 1.5 | off | 1500 | 1350 | 150 | 0 |

EXAMPLE 5

Example 5 includes another process combination according to the present invention for removing material from a substrate. According to Example 5, oxide loss can be reduced by utilizing hydrogen in the forming gas to scavenge fluorine radicals while utilizing relatively high flows of $CF_4$. Example 5 provides one example of such a process.

Figure 27A:
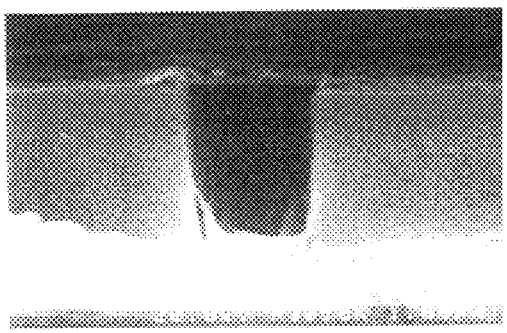
FIG. 27a represents a photomicrograph illustrating a via after treatment with a process of the present invention described in Example 5, illustrating residue remaining in the via.
Figure 27B:
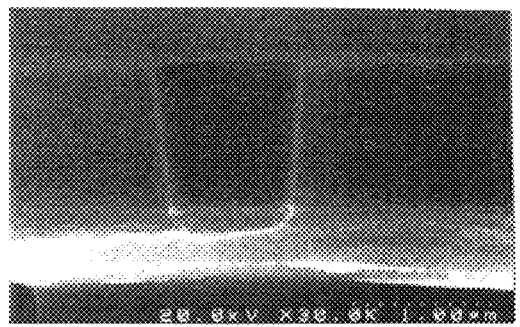
FIG. 27b represents a photomicrograph illustrating a via after treatment with a process of the present invention described in Example 5, wherein residue in the via has been removed with a deionized water rinse.

FIG. 27a illustrates a via after treatment with a process according to Example 5. As shown in FIG. 27a, residue may remain in the via after processing with the present invention. However, as illustrated by FIG. 27b, the residue may be water-removable since FIG. 27b shows a via after a deionized water rinse. No undercutting is seen in the vias shown in FIG. 27a or FIG. 27b.

EXAMPLE 5

Oxide loss can also be reduced by using the hydrogen in forming gas to scavenge the F radicals while using high $CF_4$ flows. Recipe V5 is an example.

| Step | Time (sec) | Pressure (torr) | Temp. (deg. C) | Power (watts) | $O_2$ flow (sccm) | $CF_4$ flow (sccm) | FG flow (sccm) | $CF_4$ flow (sccm) |
|---|---|---|---|---|---|---|---|---|
| 1 | MIN | 1.5 | 150 | 2000 | 1735 | 140 | 425 | 0 |
| 2 | 75 | 1.5 | 150 | 2000 | 1735 | 140 | 425 | 0 |

EXAMPLE 6

Example 6 includes another combination of process steps according to the present invention for removing material from a substrate. According to Example 6, about 9% $CF_4$ may be added to the plasma during step 3.

Figure 28A:
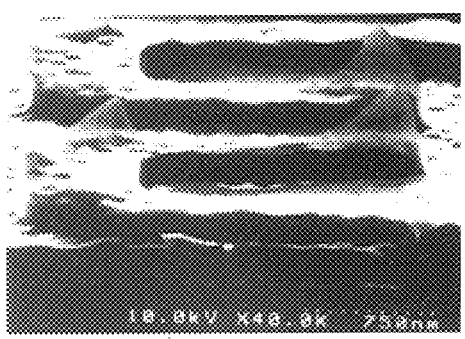
FIG. 28a represents a photomicrograph illustrating post-poly residues after treatment with a process according to the present invention described in Example 6.
Figure 28B:
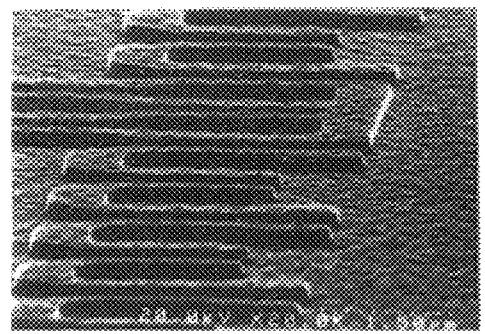
FIG. 28b represents a photomicrograph illustrating residue-free samples after treatment with a process according to the present invention described in Example 6 after a deionized water rinse.

FIG. 28a illustrates a substrate of post poly residues after treatment with a process according to the present invention. FIG. 28b illustrates residue removal after treatment with the process of Example 6 and a deionized water rinse.

EXAMPLE 6

| | | | 8" Gas Flows Step 3–9% CF4 Concentration | | | | | |
|---|---|---|---|---|---|---|---|---|
| Step | Time (sec) | Pressure (torr) | Temp. (° C.) | Power (watts) | O2 (sccm) | CF4 (sccm) | N2H2 (sccm) | CF4 (sccm) |
| 1 | Min* | 1.5 | 140 | 1500 | 2000 | Off | 300 | 5 |
| 2 | 120 | 1.5 | 140 | 1500 | 2000 | Off | 300 | 5 |
| 3 | 20 | 1.5 | Off | 1000 | 2070 | 210 | Off | 8 |

*Minimum time to reach required temperature

EXAMPLE 7

Example 7 includes another combination of process steps according to the present invention for removing material from a substrate. According to Example 7, about 7.5% $CF_4$ may be added to the plasma during step 3.

Figure 29A:
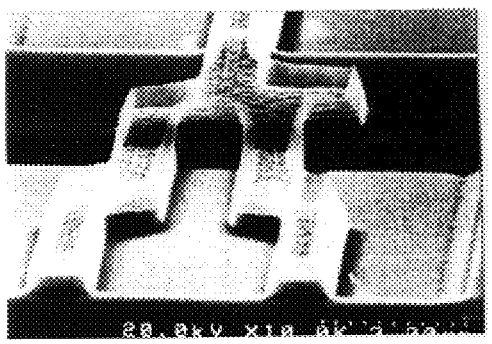
FIG. 29a represents a photomicrograph illustrating post-poly residues after treatment with a process according to the present invention described in Example 7.
Figure 29B:
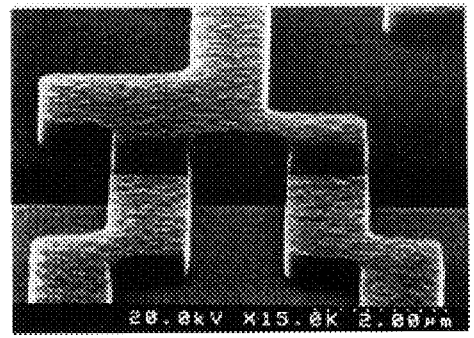
FIG. 29b represents a photomicrograph illustrating residue-free samples after treatment with a process according to the present invention described in Example 7 after rinsing with deionized water.

FIG. 29a illustrates a substrate of post poly residues after treatment with a process according to the present invention. FIG. 29b illustrates residue removal after treatment with the process of Example 7 and a deionized water rinse.

EXAMPLE 7

| | | | 6" Gas Flows Step 3–7.5% CF4 Concentration | | | | | |
|---|---|---|---|---|---|---|---|---|
| Step | Time (sec) | Pressure (torr) | Temp. (° C.) | Power (watts) | O2 (sccm) | CF4 (sccm) | N2H2 (sccm) | CF4 (sccm) |
| 1 | Min* | 1.5 | 140 | 1500 | 1700 | Off | 300 | 5 |
| 2 | 90 | 1.5 | 140 | 1500 | 1700 | Off | 300 | 5 |
| 3 | 20 | 1.5 | Off | 1250 | 1850 | 150 | Off | Off |

*Minimum time to reach required temperature

EXAMPLE 8

Example 8 includes another combination of process steps according to the present invention for removing material from a substrate. According to Example 8, about 3.75% $CF_4$ may be added to the plasma during step 3.

Figure 30A:
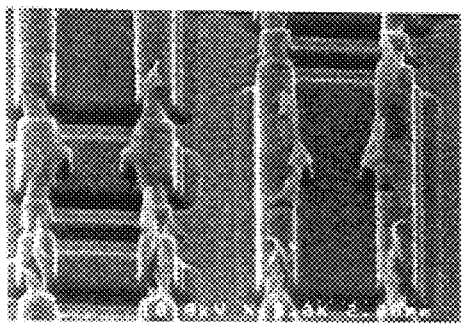
FIG. 30a represents a photomicrograph illustrating post-poly residues after treatment with a process according to the present invention described in Example 8.

FIG. 30a illustrates a substrate of post poly residues after treatment with a process according to the present invention.

Figure 30B:
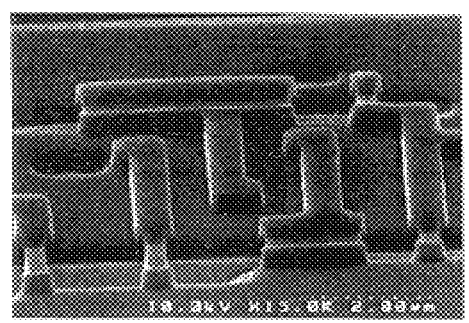
FIG. 30b represents a photomicrograph illustrating residue-free samples after treatment with a process according to the present invention described in Example 8 after rinsing with deionized water.

FIG. 30b illustrates residue removal after treatment with the process of Example 8 and a deionized water rinse.

EXAMPLE 8

| | | | 6" Gas Flows Step 3–3.75% CF4 Concentration | | | | |
|---|---|---|---|---|---|---|---|
| Step | Time (sec) | Pressure (torr) | Temp. (° C.) | Power (watts) | O2 (sccm) | CF4 (sccm) | N2H2 (sccm) | CF4 (sccm) |
| 1 | Min* | 1.5 | 140 | 1500 | 1700 | Off | 300 | 5 |
| 2 | 70 | 1.5 | 140 | 1500 | 1700 | Off | 300 | 5 |
| 3 | 20 | 1.5 | Off | 1500 | 1925 | 75 | Off | Off |

*Minimum time to reach required temperature

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for removing material from a substrate, the method comprising:
   generating an oxygen plasma in a plasma generating and discharge device including a sapphire plasma tube, generating the plasma comprising
   generating a temperature of about 270° C. in the plasma generating and discharge device,
   generating a pressure of about 1.5 torr in the plasma generating and discharge device,
   supplying from about 500 watts to about 2000 watts of power to the plasma generating and discharge device,
   introducing about 2000 sccm of at least one oxygen-containing gas into the plasma generating and discharge device;
   introducing about 5 sccm of at least one fluorine-containing compound into the plasma generating and discharge device;
   introducing about 300 sccm of a forming gas into the plasma generating and discharge device; and
   directing the plasma toward the material to be removed from the substrate.

2. The method according to claim 1, wherein the forming gas includes at least one nitrogen-containing compound and at least one hydrogen-containing compound.

3. The method according to claim 2, wherein the at least one nitrogen-containing compound includes at least one member selected from the group consisting of $N_2$ and $NO_2$ and the at least one hydrogen-containing compound includes at least one member selected from the group consisting of $H_2$ and $CHF_3$.

4. The method according to claim 2, wherein the forming gas includes about 10% hydrogen.

5. The method according to claim 1, wherein at least one oxygen-containing compound to form said plasma is provided by introducing at least one oxygen-containing compound selected from the group consisting of molecular oxygen, atomic oxygen, ozone, and oxygen-containing compounds.

6. The method according to claim 5, wherein said at least one oxygen-containing compound includes at least one compound selected from the group consisting of $N_2O$, $NO_2$, NO, $CO_2$, or CO.

7. The method according to claim 5, wherein said at least one oxygen-containing compound, said forming gas, and said at least one fluorine-containing compound are introduced into said plasma generating and discharge device simultaneously.

8. The method according to claim 1, wherein said plasma generating and discharge device utilizes microwave frequency electromagnetic radiation to generate said plasma.

9. The method according to claim 1, wherein said at least one fluorine-containing compound include s at least one member selected from the group consisting of $CF_4$, $C_2F_6$, $CHF_3$, $CFH_3$, $C_2H_2F_4$, $C_2H_4F_2$, $CH_2F_2$, $CH_3CF_3$, $C_3F_8$, $SF_6$, and $NF_3$.

10. The method according to claim 1, wherein the substrate is heated to a temperature of from about 20° C. to about 350° C.

11. The method according to claim 1, wherein said plasma generating and discharge device is supplied with power from about 500 watts to about 2000 watts.

12. The method according to claim 1, wherein said plasma generating and discharge device is supplied with a level of power sufficient to result in removal of material from the substrate without causing unwanted effects to the substrate.

13. The method according to claim 1, further comprising the steps of:
   operating the plasma generating and discharge device at multiple temperatures, multiple power levels for multiple periods of time, multiple pressures, and multiple levels of said at least one fluorine-containing compound and said forming gas.

* * * * *